(12) United States Patent
Makiyama

(10) Patent No.: US 8,980,768 B2
(45) Date of Patent: Mar. 17, 2015

(54) SEMICONDUCTOR DEVICE AND MANUFACTURING METHOD OF THE SAME

(71) Applicant: Fujitsu Limited, Kawasaki-shi, Kanagawa (JP)

(72) Inventor: Kozo Makiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/055,321

(22) Filed: Oct. 16, 2013

(65) Prior Publication Data

US 2014/0045345 A1    Feb. 13, 2014

Related U.S. Application Data

(62) Division of application No. 12/071,093, filed on Feb. 15, 2008, now Pat. No. 8,587,092.

(30) Foreign Application Priority Data

Feb. 22, 2007  (JP) ................................. 2007-042669

(51) Int. Cl.
| | |
|---|---|
| *H01L 21/02* | (2006.01) |
| *C23C 16/34* | (2006.01) |
| *H01L 21/318* | (2006.01) |
| *H01L 29/778* | (2006.01) |
| *H01L 29/20* | (2006.01) |

(52) U.S. Cl.
CPC .......... *H01L 21/0217* (2013.01); *C23C 16/345* (2013.01); *H01L 21/3185* (2013.01); *H01L 29/7787* (2013.01); *H01L 29/2003* (2013.01)
USPC ........................................................ 438/792

(58) Field of Classification Search
CPC .............. C23C 16/345; H01L 21/0217; H01L 21/3185; H01L 29/2003; H01L 29/7787
USPC .......................................................... 438/792
See application file for complete search history.

(56) References Cited

U.S. PATENT DOCUMENTS

| 4,962,065 | A | 10/1990 | Brown et al. |
| 5,264,724 | A | 11/1993 | Brown et al. |
| 6,316,794 | B1 | 11/2001 | Saitou et al. |
| 6,573,195 | B1 * | 6/2003 | Yamazaki et al. ............ 438/783 |
| 6,607,951 | B2 | 8/2003 | Chen et al. |

(Continued)

FOREIGN PATENT DOCUMENTS

| JP | 4-6835 | 1/1992 |
| JP | 5-55207 | 3/1993 |

(Continued)

OTHER PUBLICATIONS

USPTO, (Klein) Notice of Allowance and Notice of Allowability, Aug. 2, 2013, in parent U.S. Appl. No. 12/071,093 [allowed].

(Continued)

*Primary Examiner* — Long K Tran
*Assistant Examiner* — Jordan Klein
(74) *Attorney, Agent, or Firm* — Fujitsu Patent Center

(57) ABSTRACT

A protective insulation film covering a surface of a compound semiconductor region is formed to have a two-layer structure of a first insulation film and a second insulation film which have different properties. The first insulation film is a non-stoichiometric silicon nitride film while the second insulation film is a silicon nitride film in an almost stoichiometric state.

5 Claims, 19 Drawing Sheets

(56) References Cited

U.S. PATENT DOCUMENTS

| | | | |
|---|---|---|---|
| 6,933,250 B2 | 8/2005 | Totsuka et al. | |
| 6,998,695 B2 | 2/2006 | Makiyama et al. | |
| 7,002,189 B2 * | 2/2006 | Kikkawa | 257/192 |
| 7,419,862 B2 * | 9/2008 | Lim et al. | 438/197 |
| 7,494,855 B2 | 2/2009 | Kikkawa | |
| 7,989,278 B2 | 8/2011 | Kikkawa | |
| 2002/0003288 A1 | 1/2002 | Saitou et al. | |
| 2003/0081068 A1 * | 5/2003 | Hayakawa et al. | 347/56 |
| 2003/0089991 A1 | 5/2003 | Yamazaki et al. | |
| 2003/0094615 A1 | 5/2003 | Yamazaki et al. | |
| 2004/0058485 A1 | 3/2004 | Makiyama et al. | |
| 2005/0270447 A1 | 12/2005 | Tasaka et al. | |
| 2006/0084236 A1 | 4/2006 | Vogt | |
| 2006/0105106 A1 | 5/2006 | Balseanu et al. | |
| 2006/0208289 A1 | 9/2006 | Ohkawa et al. | |
| 2007/0018199 A1 * | 1/2007 | Sheppard et al. | 257/200 |
| 2007/0267655 A1 * | 11/2007 | Endoh et al. | 257/194 |
| 2008/0157121 A1 * | 7/2008 | Ohki | 257/194 |
| 2011/0089430 A1 | 4/2011 | Kikkawa | |

FOREIGN PATENT DOCUMENTS

| | | |
|---|---|---|
| JP | 2001-77127 | 3/2001 |
| JP | 2004-221325 | 8/2004 |

OTHER PUBLICATIONS

USPTO, (Klein) Non-Final Rejection, Dec. 7, 2012, in parent U.S. Appl. No. 12/071,093 [allowed].

USPTO, (Klein) Final Rejection, Jun. 21, 2010, in parent U.S. Appl. No. 12/071,093 [allowed].

USPTO, (Klein) Non-Final Rejection, Oct. 30, 2009, in parent U.S. Appl. No. 12/071,093 [allowed].

USPTO, (Klein) Restriction Requirement, Sep. 16, 2009, in parent U.S. Appl. No. 12/071,093 [allowed].

Japanese Office Action mailed Feb. 21, 2012 for corresponding Japanese Application No. 2007-042669, with Partial English-language Translation.

Polyanskiy, Mikhail, "Refractive index of $Si_3N_4$ (Silicon nitride) at 0.633 um." RefractiveIndex.INFO. 2008-2009. http://refractiveindex.info/index.php?group=CRYSTALS&material=Si3N4&wavelength=0.633>.

\* cited by examiner

RELATION BETWEEN OXYGEN ABSORPTION AMOUNT
AND REFRACTIVE INDEX

CONVENTIONAL EXAMPLE

EXAMPLE OF PRESENT INVENTION

SEMICONDUCTOR DEVICE AND MANUFACTURING METHOD OF THE SAME

CROSS-REFERENCE TO RELATED APPLICATIONS

This application is based upon and claims the benefit of priority from the prior Japanese Patent Application No. 2007-042669, filed on Feb. 22, 2007, the entire contents of which are incorporated herein by reference.

BACKGROUND OF THE INVENTION

1. Field of the Invention

The present invention relates to a semiconductor device and a manufacturing method of the same, and aims at a structure and a forming method of an insulation film, in particular, a silicon nitride (SiN) film to be disposed on a surface of a semiconductor, in particular, a compound semiconductor region for high-power output.

2. Description of the Related Art

In a semiconductor device, in particular, in a compound semiconductor device used for high-power output, a pair of ohmic electrodes and a gate electrode are formed on a surface of a compound semiconductor region whose active region is defined by a method such as ion implantation. Further, a protective insulation film made of a silicon nitride film or the like is formed in a manner to cover the surface of the compound semiconductor region and the ohmic electrodes.

A performance of the compound semiconductor device largely depends on a state of an interface between the surface of the compound semiconductor region and the protective insulation film and on a property of the protective insulation film itself. This is due to chemical and physical weakness of a surface state of the compound semiconductor. Particularly, in a semiconductor device for high-power, stability of the surface state is important. Research organizations have heretofore performed and are still performing many investigations about a good insulation film for surface protection and a matching property between a device surface and the insulation film.

(Patent Document 1)

Japanese Patent Application Laid-open No. 2001-77127

Performances required of the protective insulation film, particularly a SiN film, for protecting the surface of the compound semiconductor region are a stabilization action for the surface of the compound semiconductor region and a good insulation characteristic of the protective insulation film itself. The stabilization action for the compound semiconductor region indicates an action to restrict a chemical change phenomenon of the surface and to restrict a change in a surface electric potential due thereto by forming an insulation film layer on the surface. The good insulation performance of the protective insulation film itself indicates a state that a leak current flowing in the film is scarce even at a time of application of a higher field. In the SiN film, in particular, a leak current in the film largely changes depending on chemical bonding states of atoms of silicon (Si) and nitride (N).

For example, the insulation film superior in stabilization action for the surface of the compound semiconductor region indicates an insulation film including a lot of hydrogen (H) terminated bonds and the like in the film. Such an insulation film has a substantial chemical action for the surface of the compound semiconductor region, and depending on circumstances, there is expected an action to bring back an unstable atomic bonding state existing on the surface to a normal state.

Chemical unstableness of the surface of the compound semiconductor region leads to a current fluctuation at a time of device operation and to a reduced reliability. The insulation film having the good insulation performance of the film itself indicates an insulation film which has no free bond hands in the film. In the insulation film as above, a current flowing in the film is minute, so that a leak current through the film can be restricted and a change in film quality due to electric conduction in the film can be mitigated. In other words, a reliability of a compound semiconductor device is improved.

As described above, it is inherently difficult to achieve both of the improvement of the chemical stability on the surface of the compound semiconductor region and the good insulation performance of the insulation film itself, in view of chemical bonding of the protective insulation film.

SUMMARY OF THE INVENTION

The semiconductor device according to one aspect of an embodiment includes a compound semiconductor region; and a protective insulation film covering at least part of a surface of the compound semiconductor region, wherein the protective insulation film has a two-layer structure constituted by a first insulation film formed into a state that a degree of chemical activity to the surface of the compound semiconductor region is high, and a second insulation film stacked on the first insulation film, a chemical activity degree of the second insulation film being lower than that of the first insulation film.

A manufacturing method of a semiconductor device according to another aspect of an embodiment includes: forming a protective insulation film to have a two-layer structure constituted by a first insulation film formed into a state that a degree of chemical activity to a surface of a compound semiconductor region is high, and a second insulation film stacked on the first insulation film, a chemical activity degree of the second insulation film being lower than that of the first insulation film, in forming the protective insulation film covering at least part of the surface of the compound semiconductor region.

BRIEF DESCRIPTION OF THE DRAWINGS

FIG. 6-1A to FIG. 6-1E are schematic cross-sectional views showing step by step a manufacturing method of a Schottky gate type FET (corresponding to FIG. 1A) according to a first embodiment;

FIG. 6-2A to FIG. 6-2C are schematic cross-sectional views, continued from FIG. 6-1E, showing step by step the manufacturing method of the Schottky gate type FET (corresponding to FIG. 1A) according to the first embodiment;

FIG. 7-2 is a characteristic chart showing an improvement effect of a two-terminal characteristic according to the present invention;

FIG. 8-1A to FIG. 8-1D are schematic cross-sectional views showing step by step a manufacturing method of a Schottky gate type FET (corresponding to FIG. 1B) having a mushroom type gate electrode according to a fifth embodiment;

FIG. 8-2A to FIG. 8-2C are schematic cross-sectional views, continued from FIG. 8-1D, showing step by step the manufacturing method of the Schottky gate type FET (corresponding to FIG. 1B) having the mushroom type gate electrode according to the fifth embodiment;

FIG. 9-1A to FIG. 9-1F are schematic cross-sectional views showing step by step a manufacturing method of a Schottky gate type FET (corresponding to FIG. 1C) having a mushroom type gate electrode according to a sixth embodiment;

FIG. 9-2A to FIG. 9-2D are schematic cross-sectional views, continued from FIG. 9-1F, showing step by step the manufacturing method of the Schottky gate type FET (corresponding to FIG. 1C) having the mushroom type gate electrode according to the sixth embodiment;

FIG. 10-1A to FIG. 10-1D are schematic cross-sectional views showing step by step a manufacturing method of a MIS gate type FET (corresponding to FIG. 2A) according to a seventh embodiment;

FIG. 10-2A and FIG. 10-2B are schematic cross-sectional views, continued from FIG. 10-1D, showing step by step the manufacturing method of the MIS gate type FET (corresponding to FIG. 2A) according to the seventh embodiment;

FIG. 11-1A to FIG. 11-1D are schematic cross-sectional views showing step by step a manufacturing method of a MIS gate type FET (corresponding to FIG. 2B) having a mushroom type gate electrode according to an eighth embodiment;

FIG. 11-2A to FIG. 11-2C are schematic cross-sectional views, continued from FIG. 11-1D, showing step by step the manufacturing method of the MIS gate type FET (corresponding to FIG. 2B) having the mushroom type gate electrode according to the eighth embodiment;

FIG. 12-1A to FIG. 12-1F are schematic cross-sectional views showing step by step a manufacturing method of a MIS gate type FET (corresponding to FIG. 2C) having a mushroom type gate electrode according to a ninth embodiment; and FIG. 12-2A to FIG. 12-2D are schematic cross-sectional views, continued from FIG. 12-1F, showing step by step the manufacturing method of the MIS gate type FET (corresponding to FIG. 2C) having the mushroom type gate electrode according to the ninth embodiment.

DETAILED DESCRIPTION OF THE PREFERRED EMBODIMENTS

—Basic Gist of the Present Invention—

In a compound semiconductor device, a surface of a compound semiconductor region is often covered by an oxide of a crystal-constituting element. This oxide may sometimes act as a trap for an electron or act as a leak path having a certain conductivity.

From another view point, there is supposed a state that a bond hand is cut without the surface of the compound semiconductor region being oxidized or a state that a bond is terminated by hydrogen (H). Also in this case, there is a possibility that an oxide film acts as a trap or a leak path for an electron, similarly to in the case that the oxide is formed.

In order to solve the above-described problem, there is a method of selecting a SiN film including a lot of Si—H bonds and N—H bonds as a protective insulation film formed to cover the surface of the compound semiconductor region. In series as above in which bond hands are not completely bonded, a dangling bond tries to transit to a stable state in terms of energy, and as a result, a degree of chemical activity of the insulation film rises. When such a protective insulation film, especially a SiN film, is formed into the compound semiconductor region, the Si—H bond or the N—H bond of the SiN film generates a reaction to an oxide film and a hydrogen terminated group existing in the surface of the compound semiconductor region and the protective insulation film transits to a more stable state in terms of energy. Thereby, a surface potential is fixed and a temporal physical fluctuation of material is mitigated, so that a device characteristic and a reliability can be improved.

However, in the aforementioned protective insulation film (SiN film), since a bond hand of an atom in the film is not bonded in a stable state, an insulation performance is decreased.

More specifically, if a MIM capacitor is formed by using this protective insulation film, a current flows through the protective insulation film. In order to solve such a crucial problem, it is necessary to use a film with a correct chemical quantity ratio. However, such an insulation film is chemically quite stable and there can be hardly expected the aforementioned property changing action of the surface of the compound semiconductor region.

In the present invention, the aforementioned problems will be solved by using a protective insulation film described below. The protective insulation film in the present invention enables fabrication of a high-performance semiconductor device by stacking insulation films with different properties.

As a basic constitution of the present invention, as shown in FIG. 1A to FIG. 1C and FIG. 2A to FIG. 2C, a protective insulation film 10 is formed to have a two-layer structure constituted by a first insulation film 11 and a second insulation film 12, which have different properties.

Figure 1A:
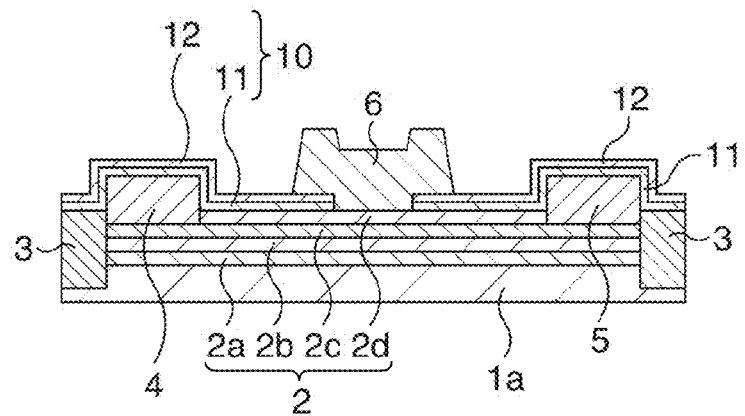
FIG. 1A to FIG. 1C are schematic cross-sectional views showing a constitution of a Schottky gate type FET according to the present invention.
Figure 1B:
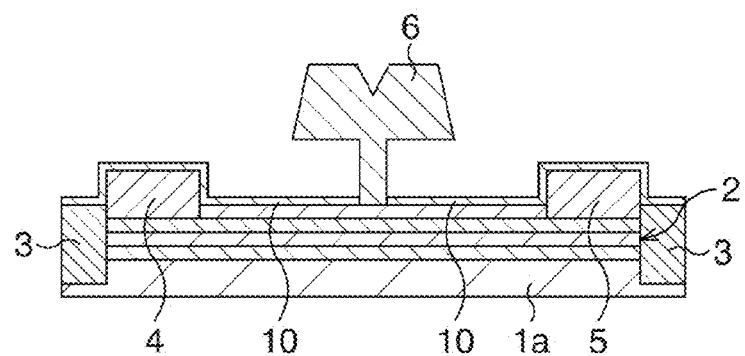
Figure 1C:
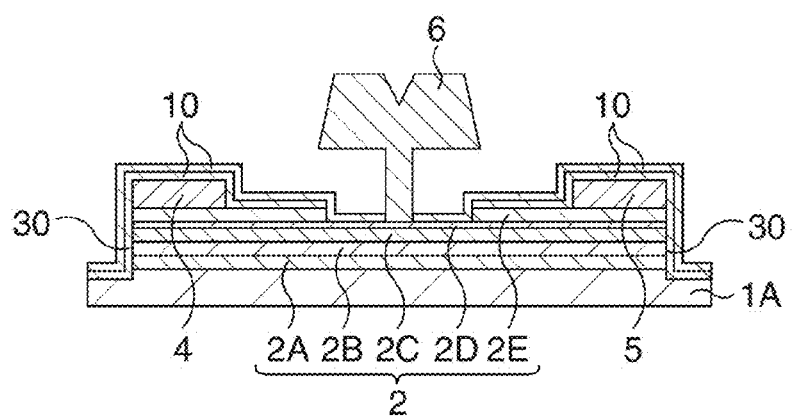
Figure 2A:
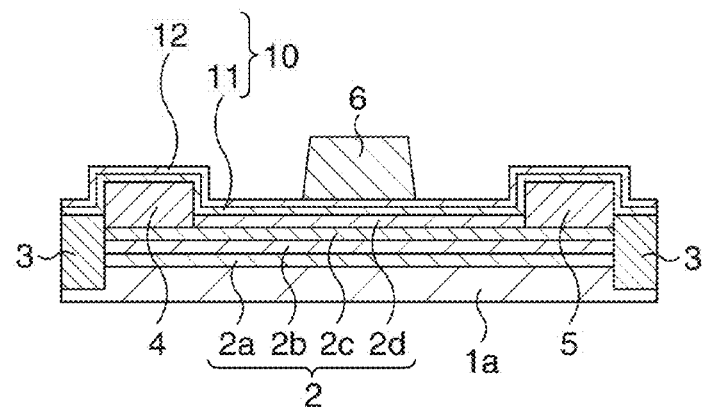
FIG. 2A to FIG. 2C are schematic cross-sectional views showing a constitution of a MIS gate type FET according to the present invention.
Figure 2B:
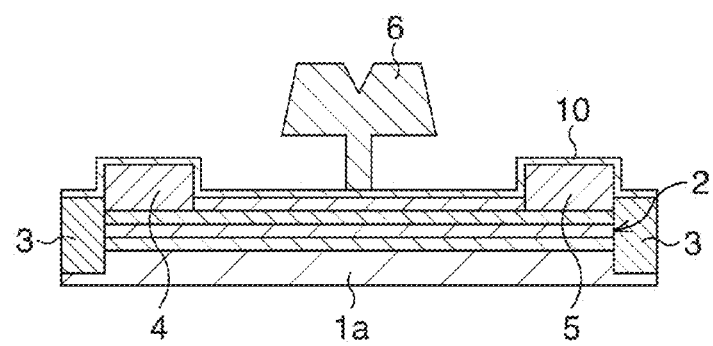
Figure 2C:
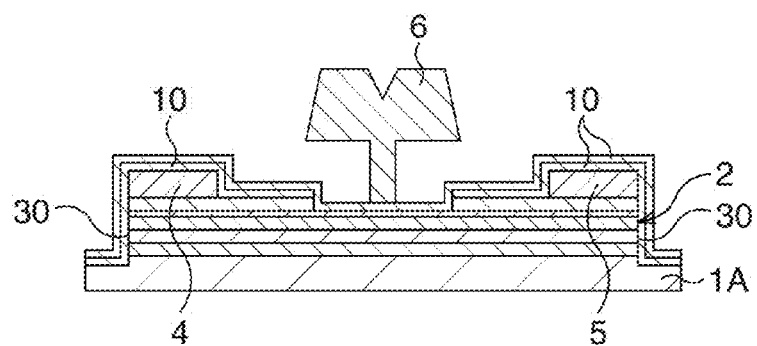

Here, FIG. 1A to FIG. 1C show a Schottky gate type FET, while FIG. 2A to FIG. 2C show a MIS gate type FET. FIG. 1A shows a Schottky gate type FET, FIG. 1B shows a Schottky gate type FET having a mushroom type gate electrode, and FIG. 1C shows another mode of a Schottky gate type FET having a mushroom type gate electrode. FIG. 2A shows a MIS gate type FET, FIG. 2B shows a MIS gate type FET having a mushroom type gate electrode, and FIG. 2C shows another mode of a MIS gate type FET having a mushroom type gate electrode.

In the compound semiconductor devices of FIG. 1A, FIG. 1B, FIG. 2A and FIG. 2B, there is formed a compound semiconductor region 2 (made by sequentially stacking a buffer layer 2a, a GaN electron transit layer 2b, an AlGaN electron supply layer 2c and a GaN surface layer 2d) on a semi-insulating SiC substrate 1a, and an active region is defined in the compound semiconductor region 2 by an element isolation structure 3.

On the other hand, in the compound semiconductor devices of FIG. 1C and FIG. 2C, there is formed a compound semiconductor region 2 (made by sequentially stacking a buffer layer 2A, an InGaAs electron transit layer 2B, an InAlAs electron supply layer 2C, an InP etching stopper layer 2D and an InGaAs low resistance layer 2E) on a semi-insulating InP substrate 1A, and an active region is defined in the compound semiconductor region 2 by a mesa etching region 30.

A pair of ohmic electrodes 4, 5 functioning as source/drain are pattern-formed on the active region (on the electron supply layer 2c in FIG. 1A, FIG. 1B, FIG. 2A and FIG. 2B, and on the low resistance layer 2E in FIG. 1C and FIG. 2C).

In FIG. 1A to FIG. 1C, a gate electrode 6 is formed directly on the active region between the ohmic electrodes 4, 5. Here, in FIG. 1A, the protective insulation film 10 of the present invention is formed in a manner to cover the compound semiconductor region 2 including on the ohmic electrodes 4, 5 and to get into under side surfaces of the gate electrode 6. In FIG. 1B and FIG. 1C, the protective insulation film 10 is formed in a manner to cover the compound semiconductor region 2 including on the ohmic electrodes 4, 5 and to reach side surfaces of a stem part of the mushroom type gate electrode 6.

On the other hand, in FIG. 2A to FIG. 2C, the protective insulation film 10 is formed in a manner to cover the compound semiconductor region 2 including on the ohmic electrodes 4, 5, and a gate electrode 6 is formed on the active region between the ohmic electrodes 4, 5 via the protective insulation film 10. Here, the protective insulation film 10 under the gate electrode 6 functions as a gate insulation film.

In FIG. 1A, FIG. 1B, FIG. 2A and FIG. 2B, the protective insulation film 10 is formed into a single layer, while in FIG. 1C and FIG. 2C, the protective insulation film 10 is formed into two layers except under the gate electrode 6 and in a neighborhood thereof (formed into a single layer in these parts) due to a structural reason. Here, for the sake of descriptional convenience, one layer of the protective insulation film 10 constituted by the first and second insulation films 11, 12 is referred to as "single layer".

In FIG. 1A and FIG. 2A, the protective insulation film 10 is illustrated as constituted by the first and second insulation films 11, 12, while in FIG. 1B, FIG. 1C, FIG. 2B and FIG. 2C, illustration of the first and second insulation films 11, 12 is omitted and the protective insulation film 10 is illustrated as a single layer, for the sake of illustrative convenience.

The protective insulation film 10 has a two-layer structure in which the first insulation film 11 and the second insulation film 12 are sequentially stacked, and is formed as described in the following inventive aspects.

(Inventive Aspect 1)

First, there will be described a first insulation film 11 which is first deposited on a surface of a compound semiconductor region.

On the surface of the semiconductor region, in particular of a compound semiconductor region exist a lot of oxides of crystal-constituting elements and bonds which are hydrogen terminated and hydroxyl terminated. On the other hand, an insulation film, in particular a silicon nitride film (SiN film) generally includes large quantity of hydrogen atoms. The hydrogen atom is bonded to Si or N, decreasing chemical stability compared with $Si_3N_4$. In other words, it can be said that the SiN film is in a state of easily causing a chemical action to a crystal to be deposited. If the SiN film having such a property is deposited on the surface of the compound semiconductor region, there is a possibility that oxygen on the compound semiconductor region reacts with hydrogen in the SiN, for example. As a result of the reaction, there are realized removal of impurity from the surface of the compound semiconductor region, separation of hydrogen from the SiN film, and direct bonding of a semiconductor-constituting element and a SiN-constituting element. In the surface of the compound semiconductor region in which the reaction progresses as above, unnecessary surface potential change during a device operation occurs less frequently compared with in a surface of a compound semiconductor region with a trap having a certain time constant. As for a physical characteristic of the SiN film, an insulation film is preferable which has high concentration of Si—H or N—H and whose refractive index deviates from stoichiometry.

Next, a second insulation film 12 deposited on the first insulation film 11 will be described.

In the aforementioned SiN film, since the bond of $Si_3N_4$ is inevitably not completed, a weak current flows in the film, though the SiN film is the insulation film. In order to solve such an inconvenience as the insulation film, the second insulation film 12 which is superior in insulation performance is deposited on the first insulation film 11. The film superior in insulation performance is an insulation film which has a small number of Si—H or N—H bonds and whose refractive index is almost stoichiometric. Such an insulation film has a characteristic that there are a small number of bonds in weak bond states and a small number of ions contributing to electric conduction.

As described above, by forming the protective insulation film 10 into the two-layer structure of the first insulation film 11 and the second insulation film 12, it becomes possible to satisfy both of conflicting requests of improvement of chemical stability on the surface of the compound semiconductor region and improvement of the insulation performance of the protective insulation film.

As a technology of forming a film having a stoichiometric property on a compound semiconductor region in a compound semiconductor device, there is disclosed, for example in Patent Document 1, a technology of forming an electrode on a compound semiconductor region via a nitrided metal having a stoichiometric property. However, it is needless to say that the technology is an invention completely different from the present invention.

(Inventive Aspect 2)

First, there will be described a first insulation film 11 which is first deposited on a surface of a compound semiconductor region.

As described above, in a SiN film contacting the surface of the compound semiconductor region, an oxide of a crystal-constituting element or hydrogen-terminated and hydroxyl-terminated bonds is required to be reduced or brought back into a normal bond state. In Inventive Aspect 1, the SiN film which includes a lot of hydrogen and is chemically unstable is used as the first insulation film 11. However, a similar effect can be realized by increasing a hydrogen concentration in plasma if the first insulation film 11 is formed by a plasma CVD method, for example. When the SiN film is deposited by the plasma CVD method, an $NH_3$ gas can be used as a nitrogen material gas.

It is needless to say that an $N_2$ gas is most suitable for the nitrogen material gas in the plasma CVD method. Hereinafter, there will be described a case that the $NH_3$ gas is used mainly as the nitrogen material gas.

In this case, the surface of the compound semiconductor region is exposed to a hydrogen radical caused by separated $NH_3$ at the beginning of film formation. At this stage, chemical unstableness in the surface of the compound semiconductor region is eliminated depending on the circumstances. In other words, the chemical instability of the surface of the compound semiconductor region is eliminated by forming the SiN film under a circumstance in which a lot of radical hydrogen is included. In this case, a refractive index of the insulation film 11 is not restricted. However, in general, an insulation performance of a SiN film made by using $NH_3$ as the nitrogen material gas is not quite superior.

In order to solve such an inconvenience, a second insulation film 12 is deposited on the first insulation film 11. The second insulation film 12 is an insulation film which includes a small number of Si—H or N—H bonds and whose refractive index is almost stoichiometric, as described in Inventive Aspect 1. Such an insulation film has a characteristic that there are small number of bonds in weak bond states and that there are a small number of ions contributing to electric conduction.

As described above, by forming the protective insulation film 10 into a two-layer structure of the first insulation film 11 and the second insulation film 12, it becomes possible to satisfy both of conflicting requests of improvement of chemical stability on the surface of the compound semiconductor region and improvement of the insulation performance of the protective insulation film, similarly in Inventive Aspect 1.

(Inventive Aspect 3)

It is preferable from a viewpoint of an insulation performance that a second insulation film 12 deposited on a first insulation film 11 is a film formed by means of plasma exited by a low frequency RF (film formed by means of a plasma CVD method by the low frequency RF). It is known, in general, a SiN film deposited by the low frequency RF (for example, 380 kHz) is superior in insulation property and density property. However, ionicity of a reactive species is strong at a film-forming time, causing a critical damage to a compound semiconductor surface, especially to an electric conductive portion between source/drain. However, in a structure according to the present invention, ion energy at a time of deposition of the second insulation film 12 is absorbed by the first insulation film 11, so that a substrate 1 side is not damaged. By the above structure and method, there is realized a protective insulation film 10 of a two-layer structure which is more superior in insulation property than the cases of Inventive Aspects 1 and 2.

As described above, by forming the protective insulation film 10 into the two-layer structure of the first insulation film 11 and the second insulation film 12, it becomes possible to satisfy both of conflicting requests of improvement of chemical stability on the surface of the compound semiconductor region and improvement of the insulation performance of the protective insulation film, similarly in Inventive Aspect 1.

(Inventive Aspect 4)

In Inventive Aspect 1 to Inventive Aspect 3, there is used the insulation film which is chemically stable and whose refractive index is almost stoichiometric (stoichiometric or close thereto), as the second insulation film 12. In this case, the second insulation film 12 is easy to absorb oxygen, carbon, moisture and the like on its surface. It is well known that if oxygen, carbon, moisture and the like, for example, have been absorbed and a new SiN film is stacked thereon, the SiN film stacked thereon is adversely affected. As a method to prevent such absorption of oxygen and the like, a protective insulation film 10 according to Inventive Aspect 4 is effective.

Figure 3:
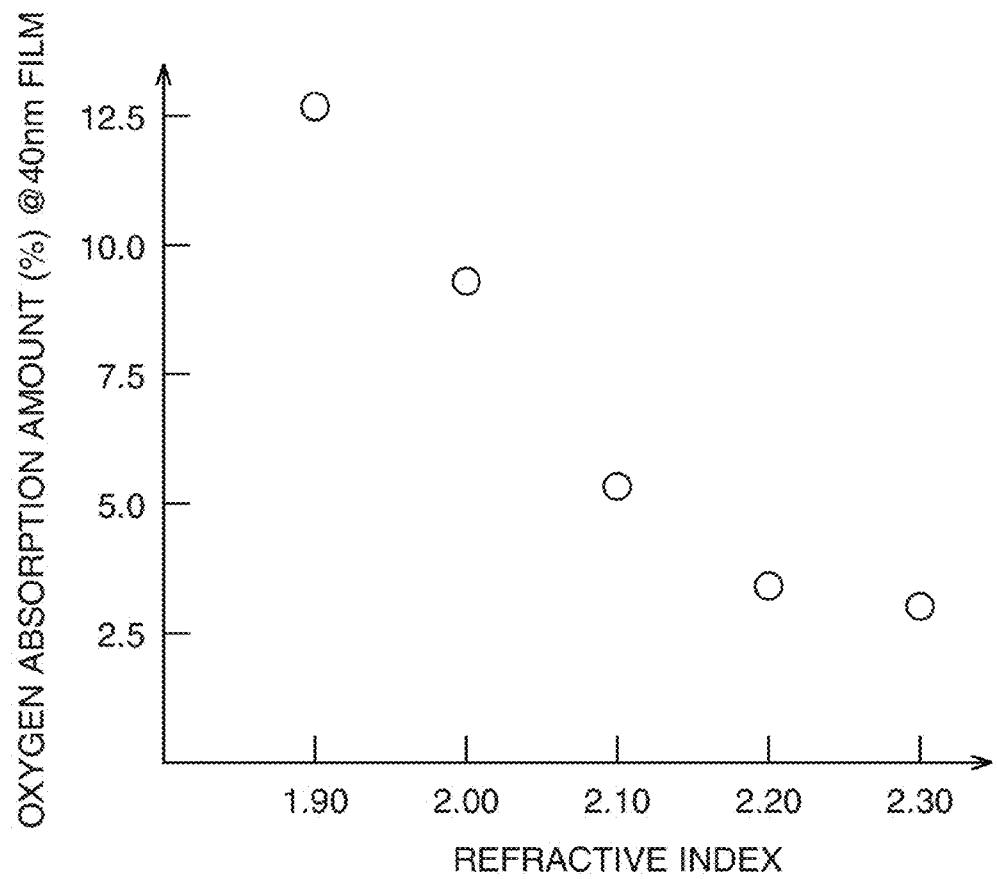
FIG. 3 is a characteristic chart showing a relation between an oxygen absorption amount and a refractive index in a SiN film surface.

An experiment of the present inventor makes it clear that as shown in FIG. 3 there is a relation between a Si/N ratio (proportional to a refractive index) of Silicon nitride and an absorption ratio of oxygen and carbon on a SiN film surface. Here, when the refractive index is increased from 1.90, for example, an oxygen absorption amount steeply decreases in accordance with increase of the refractive index until the refractive index reaches about 2.15. Further, when the refractive index is increased from about 2.15 to about 2.20, the oxygen absorption amount decreases, though not as steeply as above. Even if the refractive index is larger than 2.20, a large decreasing ratio of the oxygen absorption amount is not confirmed. In other words, this fact means that a large improvement effect in decrease of the oxygen absorption amount is attained by making the refractive index equal to about 2.15 or more and that more superior improvement effect in decrease of the oxygen absorption amount is attained by making the refractive index equal to about 2.20 or more.

The above-described problem is solved by taking the result in FIG. 3 into consideration and depositing a third insulation film 13 on the second insulation film 12 as shown in FIG. 4A to FIG. 4C and FIG. 5A to FIG. 5C. As the third insulation film 13, a SiN film is desirable which has a large Si/N ratio (3/4 or more) and a refractive index of about 2.15 or more, more preferably of about 2.20 or more, considering the result of FIG. 3.

Figure 4A:
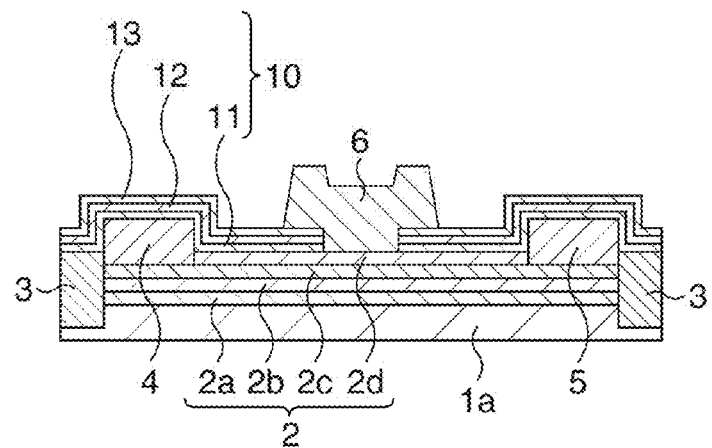
FIG. 4A to FIG. 4C are schematic cross-sectional views showing a constitution of a Schottky gate type FET according to the present invention.
Figure 4B:
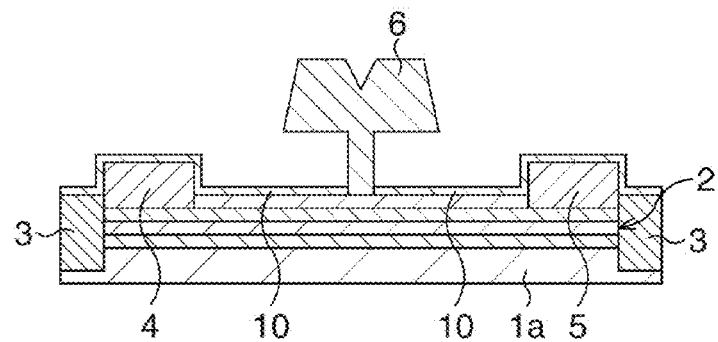
Figure 4C:
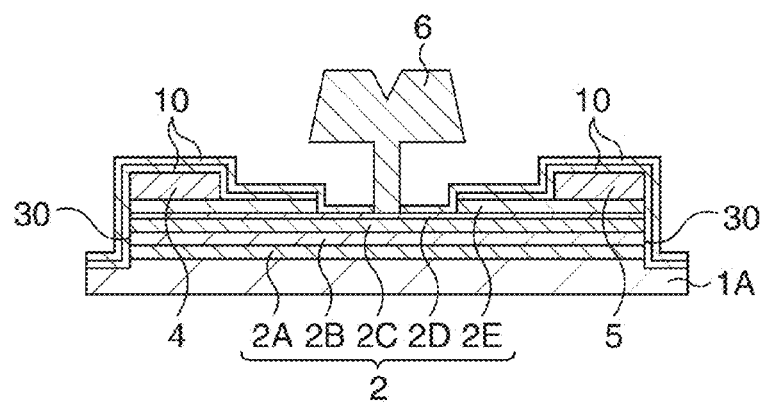
Figure 5A:
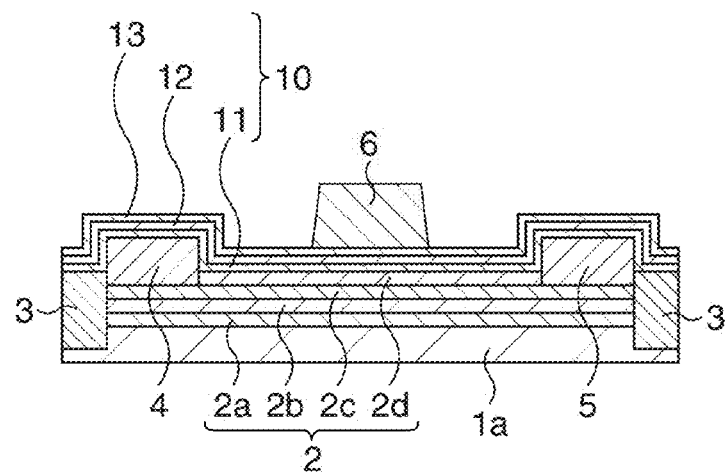
FIG. 5A to FIG. 5C are schematic cross-sectional views showing a constitution of a MIS gate type FET according to the present invention.
Figure 5B:
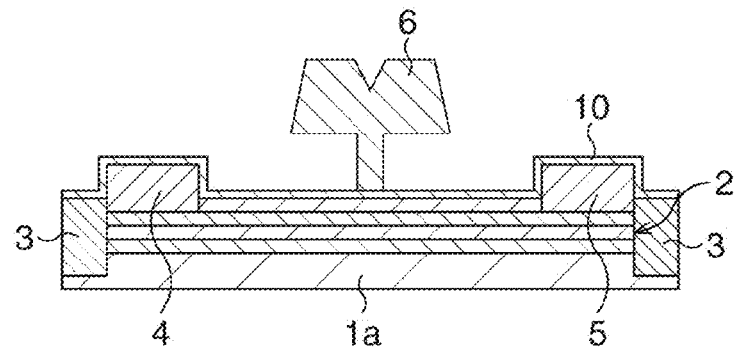
Figure 5C:
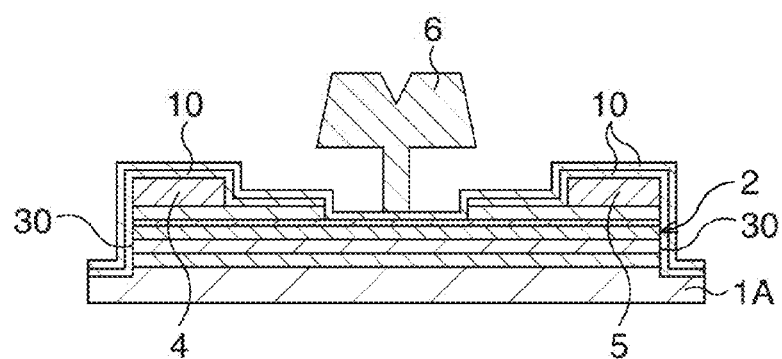

Here, as for FIG. 4A to FIG. 4C and FIG. 5A to FIG. 5C, similarly to FIG. 1A to FIG. 1C and FIG. 2A to FIG. 2C, FIG. 4A to FIG. 4C show Schottky gate type FETs while FIG. 5A to FIG. 5C show MIS gate type FETs. FIG. 4A shows a Schottky gate type FET, FIG. 4B shows a Schottky gate type FET having a mushroom type gate electrode, and FIG. 4C shows another mode of a Schottky gate type FET having a mushroom type gate electrode. FIG. 5A shows a MIS gate type FET, FIG. 5B shows a MIS gate type FET having a mushroom type gate electrode, and FIG. 5C shows another mode of a MIS gate type FET having a mushroom type gate electrode.

In FIG. 4A, FIG. 4B, FIG. 5A and FIG. 5B, the protective insulation film 10 is formed into a single layer, while in FIG. 4C and FIG. 5C, the protective insulation film 10 is formed into two layers except under a gate electrode 6 and in a neighborhood thereof (here, formed into a single layer) due to a structural reason. Here, for the sake of descriptional convenience, one layer of the protective insulation film 10 constituted by the first to third insulation films 11, 12, 13 is referred to as "single layer".

In FIG. 4A and FIG. 5A, the protective insulation film 10 is illustrated as constituted by the first and second insulation films 11, 12, while in FIG. 4B, FIG. 4C, FIG. 5B and FIG. 5C, illustration of the first to third insulation films 11 to 13 is omitted and the protective insulation film 10 is illustrated as a single layer, for the sake of illustrative convenience.

As described above, by forming the protective insulation film 10 into a three-layer structure of the first insulation film 11, the second insulation film 12 and the third insulation film 13, it becomes possible to satisfy both of conflicting requests of improvement of chemical stability on the surface of the compound semiconductor region and improvement of an insulation performance of the protective insulation film, and excessive absorption of oxygen and the like to an insulation film surface is restricted.

It should be noted that though the first insulation film 11 and the second insulation film 12 are exemplified by the SiN films in Inventive Aspect 1 to Inventive Aspect 4, the present invention is not limited thereto.

—Concrete Embodiments the Present Invention is Applied to—

Based on the above-described basic gist of the present invention, concrete embodiments to which the present invention is applied will be described in detail with reference to the drawings.

—First Embodiment—

The present embodiment corresponds to above-described Inventive Aspect 1, and a constitution of a Schottky gate type FET shown in FIG. 1A will be described together with a manufacturing method thereof.

FIG. 6-1A to FIG. 6-1E and FIG. 6-2A to FIG. 6-2C are schematic cross-sectional views showing step by step a manufacturing method of a Schottky gate type FET (corresponding to FIG. 1A) according to a first embodiment.

In the present embodiment, first, a first insulation film 11 being a non-stoichiometric SiN film is formed by using a plasma CVD method on a compound semiconductor region 2 on which a pair of ohmic electrodes 4, 5 are formed. The non-stoichiometric SiN film must include a lot of Si—H bonds or N—H bonds. As an appropriate forming method of the first insulation film 11, there is a method in which a refractive index (here, a refractive index in relation to a light of a wavelength of 633 nm) is made higher than 2.0 (for example, 2.1 or more). In this case, the Si—H bonds increase in the SiN film (for example, $1.0 \times 10^{22}/cm^3$ or more), and a chemical action is generated to a surface of the compound semiconductor region, so that firm joining (passivation property) to the surface is realized.

On the other hand, as an appropriate forming method of the first insulation film 11, there is a method in which the refractive index (here, the refractive index in relation to the light of the wavelength of 633 nm) is made lower than 2.0 (for example, 1.9 or less). In this case, the N—H bonds increase in the SiN film (for example, $1.0 \times 10^{22}/cm^3$ or more), and a chemical action is generated to the surface of the compound semiconductor region, so that firm joining (passivation property) to the surface is realized. However, bonding energy of N—H is larger than that of Si—H, and also from a viewpoint of reactivity, the SiN film including a lot of Si—H bonds is more advantageous.

Subsequently, a second insulation film 12 which is superior in insulation property is formed on the first insulation film 11. As the second insulation film 12, suitable is a SiN film which has a small number of Si—H bonds or N—H bonds (for example, the number of each of the Si—H bonds and the N—H bonds is less than $1.0 \times 10^{22}/cm^3$) and which is in a state of almost stoichiometry. From a viewpoint of a refractive index, a value around 2.0 (for example, a value larger than 1.9 and smaller than 2.1) is preferable.

In order to maintain the insulation performance, in a protective insulation film 10 of a two-layer structure of the present embodiment, it is required that the first insulation film has a minimum film thickness that enables property change of the surface of the compound semiconductor region. Such a film thickness varies depending on a semiconductor material and a degree of change.

Figures 1A, 6:
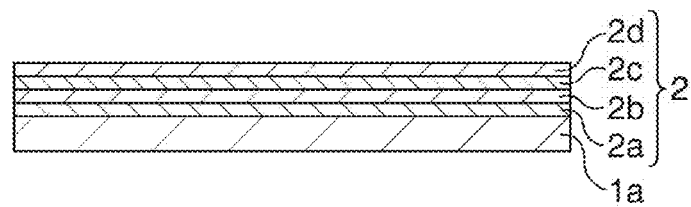
Figures 1B, 6:
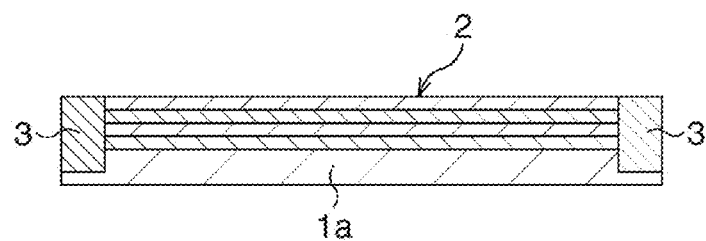
Figures 1C, 6:
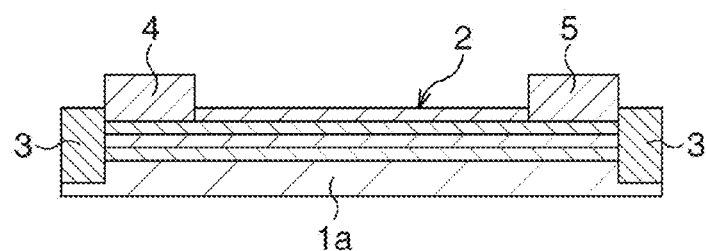

In order to manufacture the Schottky gate type FET of the present embodiment, first, as shown in FIG. 6-1A, on a semi-insulating Sic substrate 1a are sequentially epitaxially grown by a MOCVD (Metal Organic Chemical Vapor Deposition) method a buffer layer 2a, an electron transit layer 2b made of GaN, an electron supply layer 2c made of AlGaN, and a surface layer 2d made of GaN, so that a compound semiconductor region 2 is formed. Among the respective layers, the buffer layer 2a plays a role of preventing propagation of a defect of a surface of the SiC substrate 1 to the electron transit layer 2b.

Subsequently, as shown in FIG. 6-1B, for the purpose of inactivating a region (element isolation region) in which an element is not formed, Ar, for example, is injected to form an interelement isolation structure 3, whereby an active region is defined in the compound semiconductor region 2.

Subsequently, as shown in FIG. 6-1C, first, an ohmic electrode formation portion of the surface layer 2d is removed by patterning and dry-etching.

Next, on the compound semiconductor region 2 are sequentially deposited Ti and Al in thicknesses of about 20 nm and about 200 nm, for example, respectively by a vacuum deposition method. Then, a lift off is performed with a heated organic solvent, so that a pair of ohmic electrodes 4, 5 is formed on the electron supply layer 2c which is exposed in the above-described ohmic electrode formation portion. Thereafter, by applying a heat treatment, an ohmic contact is formed between the electron supply layer 2c and the ohmic electrodes 4, 5.

Figures 1D, 6:
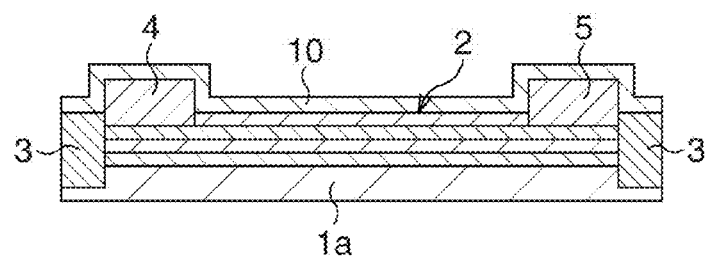

Subsequently, as shown in FIG. 6-1D, a first insulation film 11 and a second insulation film 12 of Inventive Aspect 1 are sequentially deposited on an entire surface of the compound semiconductor region 2 in a manner to cover the ohmic electrodes 4, 5, so that a protective insulation film 10 is formed.

Figures 1E, 6:
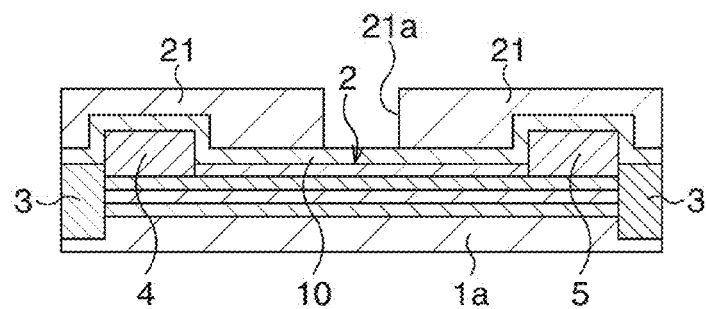
Figures 2A, 6:
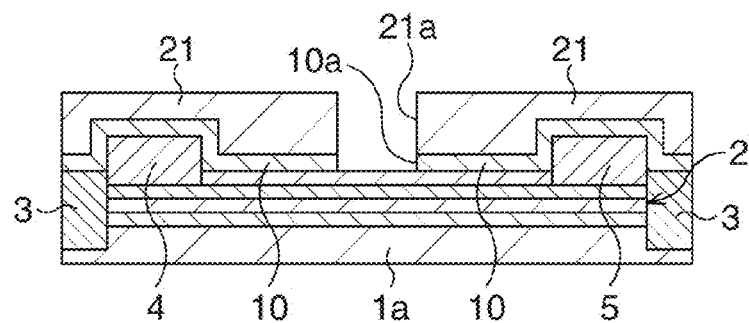
Figures 2B, 6:
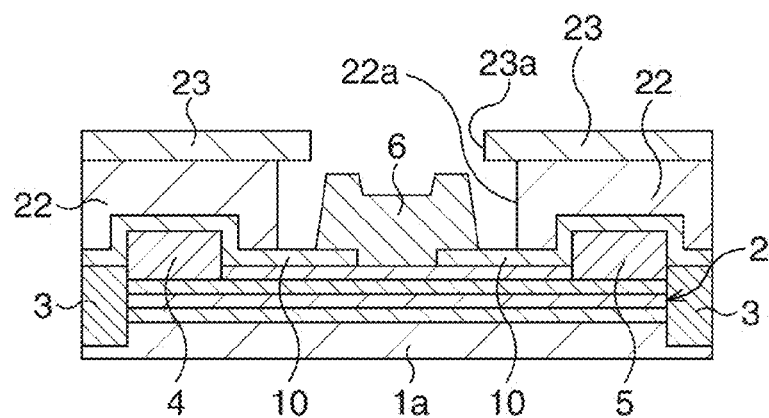
Figures 2C, 6:
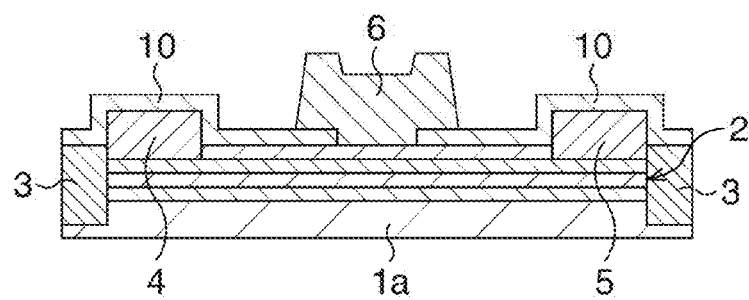

Subsequently, as shown in FIG. 6-1E, a resist 21 is applied and formed on an entire surface and an opening 21a to coincide with a gate electrode region is formed in the resist 21 by lithography.

Subsequently, as shown in FIG. 6-2A, the protective insulation film 10 is dry etched with the resist 21 being a mask and using $SF_6$ as an etching gas, so that an opening 10a is formed in the protective insulation film 10.

Subsequently, after the resist 21 is removed by a peeling treatment or the like, as shown in FIG. 6-2B, a lower-layer resist 22 (brand name: PMGI, made by MicroChem Corp, U.S.) and an upper-layer resist 23 (brand name: PF132-A8, made by Sumitomo Chemical Co., Ltd.) are applied and formed respectively by a spin-coat method, for example, and an opening 23a of 0.8 μm in diameter is formed in the upper-layer resist 23 by ultraviolet exposure.

Next, with the upper-layer resist 23 being a mask, the lower-layer resist 22 is wet etched with an alkaline developing solution. By this etching, an opening 22a is formed in the lower-layer resist 22, so that an eaves structure shown in the drawing is formed.

Next, with the upper-layer resist 23 and the lower-layer resist 22 being masks, a gate metal (Ni: about 10 nm in film thickness/Au: about 300 nm in film thickness) is vapor deposited on an entire surface including in the openings 23a, 22a. Here, for the sake of illustrative convenience, illustration of the gate metal deposited on the upper-layer resist 23 is omitted.

Subsequently, as shown in FIG. 6-2C, a lift-off is performed by using a heated organic solvent to form a gate electrode 6 on the compound semiconductor region 2 in the active region.

Thereafter, through processes of formation of an interlayer insulation film, a contact hole, various wirings and the like, the Schottky gate type FET according to the present embodiment is completed.

Hereinafter, a constitution of the protective insulation film 10 in the present embodiment will be described in detail.

The plasma CVD method is used for formation of the first insulation film 11. With an excitation frequency of plasma being 13.56 MHz, a high-frequency output being 50 W, a gas flow rate being $SiH_4/N_2/He=3$ sccm/150 sccm/1000 sccm, the first insulation film 11 is formed to be about 5 nm in film thickness. A density of Si—H bonds contained in SiN is about $2.0 \times 10^{22}/cm^3$, a density of N—H bonds is about $4.0 \times 10^{21}/cm^3$, and a refractive index is about 2.3.

Next, the plasma CVD method is used for forming the second insulation film 12. With an excitation frequency of plasma being 13.56 MHz, a high-frequency output being 50 W, a gas flow rate being $SiH_4/N_2/He=2$ sccm/150 sccm/1000 sccm, the second insulation film 12 is formed to be about 35 nm in film thickness. A density of Si—H bonds contained in SiN is about $0.9 \times 10^{22}/cm^3$, a density of N—H bonds is about $8.0 \times 10^{21}/cm^3$, and a refractive index is about 2.0.

In the Schottky gate type FET employing the protective insulation film 10, a fluctuation of a drain current due to a trap of the surface of the compound semiconductor region 2 is restricted and a current amount flowing in the protective insulation film 10 is drastically decreased.

Figure 7:
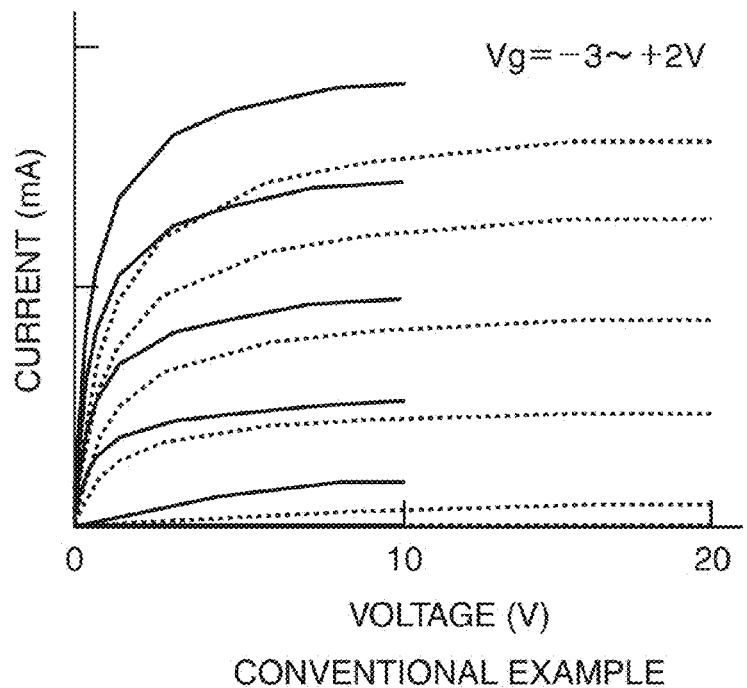
FIG. 7-1 are characteristic charts showing an improvement effect of a three-terminal characteristic according to the present invention.
Figure 1:
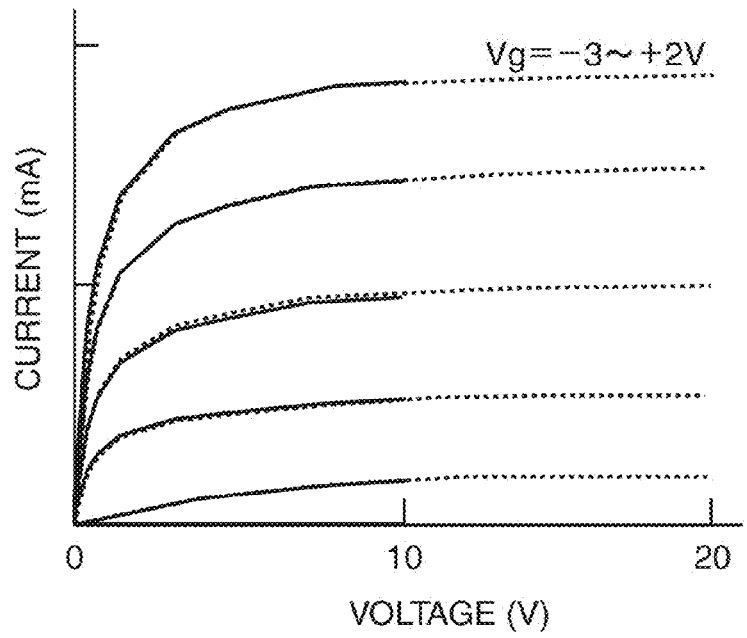

Chemical stability can be evaluated by the fluctuation of the drain current. In FIG. 7-1, a three-terminal characteristic is shown by a comparison of an example of the present invention (lower graph) and a conventional example (upper graph), with a solid line indicating a state (state "a") that a drain current is applied up to 10 V, and a broken line indicating a sate (state "b") that the drain current is applied up to 20 V, respectively. When attention is focused on a range of 0 V to 10 V of the drain current, in the conventional example, a fluctuation is noticed in the state "a" and the state "b", while in the example of the present invention, the state "a" coincides with the state "b". This fact means that the drain current fluctuation (current collapse) is improved in a semiconductor device according to the present invention.

Figures 2, 7:
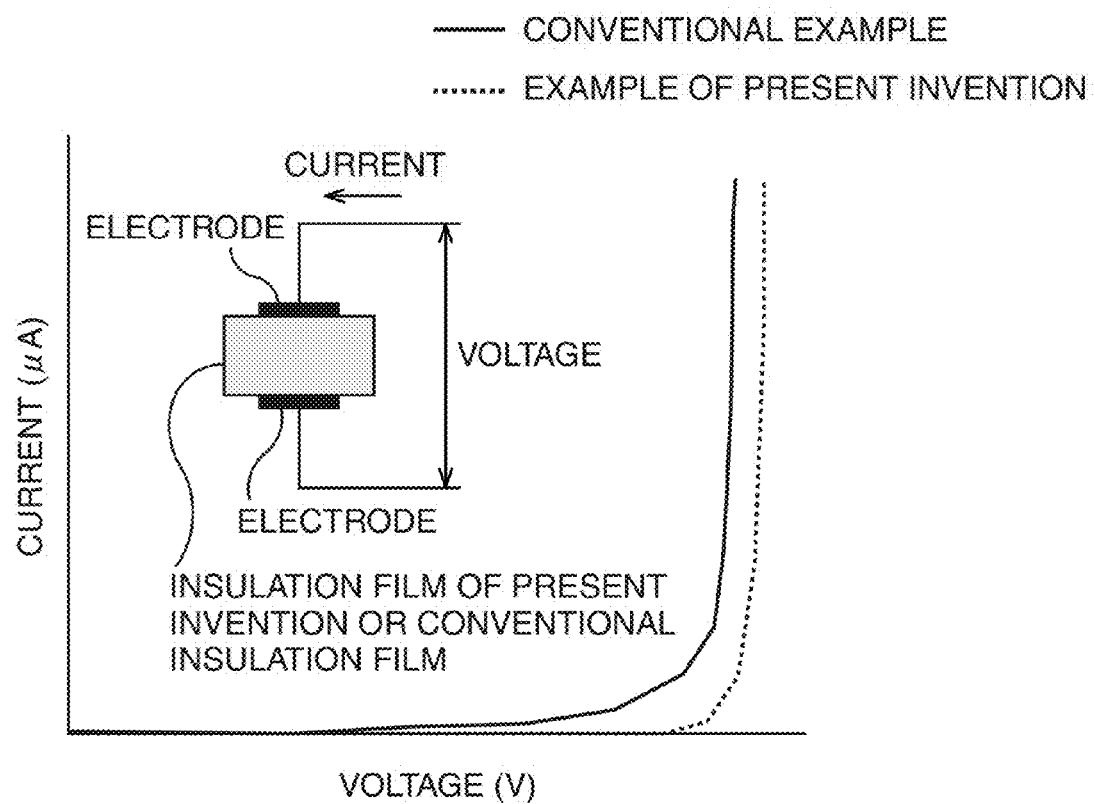

The insulation property of the insulation film itself can be evaluated by a leak current amount in the film. As shown in FIG. 7-2, in terms of a two-terminal characteristic, a current value in the example of the present invention (indicated by a broken line) is lower than that in the conventional example (indicated by a solid line) for the same voltage, and the leak current amount is decreased.

It is known by the above that in the insulation film according to the present invention, both of superior chemical stability and a low leak current amount can be obtained, compared with the conventional insulation film.

As for a crystal (epi) structure, the surface layer made of GaN may not be used depending on requested characteristics, but such a structure is also a device structure which enables an effect of the present invention.

As described above, according to the present invention, it becomes possible to satisfy both of conflicting requests required of the protective insulation film 10, the requests being improvement of chemical stability on the surface of the compound semiconductor region 2 and the good insulation performance of insulation film itself, and a Schottky gate type FET with a high performance and a superior reliability can be realized.

—Second Embodiment—

The present embodiment corresponds to above-described Inventive Aspect 2, and a constitution of a Schottky gate type FET shown in FIG. 1A will be described together with a manufacturing method thereof.

In the present embodiment, first, a first insulation film 11 being a SiN film is formed, by using a plasma CVD method, on a compound semiconductor region 2 on which a pair of ohmic electrodes 4, 5 are formed. In forming the first insulation film 11, in order to generate a chemical action to a surface of the compound semiconductor region 2 to realize firm bonding (passivation property) to the surface, film forming is performed in a state that excessive hydrogen plasmas exist in plasmas. A property changing action to the surface of the changed compound semiconductor region 2 is not achieved only by the action of Si—H bonding or N—H bonding, but can be realized also by the hydrogen plasma existing in the plasmas at the time of film formation. The hydrogen plasma contributes to removal of an impurity on the surface of the compound semiconductor region 2 and bond formation of a semiconductor constitutional element and a constitutional element of the SiN film.

As a second insulation film 12, suitable is a SiN film which has a small number of Si—H bonds or N—H bonds and which is in a state of almost stoichiometry. From a viewpoint of a refractive index, a value around 2.0 is preferable.

In a protective insulation film 10 according to the present embodiment, it is also possible to employ a film in a state of almost stoichiometry as the first insulation film 11. In this case, a high insulation performance of the entire protective insulation film 10 can be realized.

In order to manufacture the Schottky gate type FET of the present embodiment, the processes of FIG. 6-1A to FIG. 6-2C in the first embodiment are performed.

Hereinafter, a constitution of the protective insulation film 10 in the present embodiment will be described in detail.

A plasma CVD method is used for forming the first insulation film 11. With an excitation frequency of plasma being 13.56 MHz, a high-frequency output being 50 W, a gas flow rate being $SiH_4/NH_3/N_2/He=5$ sccm/10 sccm/150 sccm/1000 sccm, the first insulation film 11 is formed to be about 5 nm in film thickness. A density of Si—H bonds contained in SiN is about $2.4\times10^{22}/cm^3$, a density of N—H bonds contained is about $6.0\times10^{21}/cm^3$, and a refractive index is about 2.3.

Next, the plasma CVD method is used for forming the second insulation film 12. With an excitation frequency of plasma being 13.56 MHz, a high-frequency output being 50 W, a gas flow rate being $SiH_4/N_2/He=2$ sccm/150 sccm/1000 sccm, the second insulation film 12 is formed to be about 35 nm in film thickness. A density of Si—H bonds contained in SiN is about $0.9\times10^{22}/cm^3$, a density of N—H bonds is about $8.0\times10^{21}/cm^3$, and a refractive index is about 2.0.

In the Schottky gate type FET employing the protective insulation film 10, a fluctuation of a drain current due to a trap of the surface of the compound semiconductor region 2 is restricted and a current amount flowing in the insulation film is drastically decreased. By adapting the present invention, an effect similar to that of the first embodiment can be obtained.

As described above, according to the present embodiment, it becomes possible to satisfy both of conflicting requests required of the protective insulation film 10, the requests being improvement of chemical stability on the surface of the compound semiconductor region 2 and the good insulation performance of the insulation film itself, and a Schottky gate type FET with a high performance and a superior reliability can be realized.

—Third Embodiment—

The present embodiment corresponds to above-described Inventive Aspect 3, and a constitution of a Schottky gate type FET shown in FIG. 1A will be described together with a manufacturing method thereof.

In the present embodiment, a first insulation film 11 being a SiN film is formed, by using a plasma CVD method, on a compound semiconductor region 2 on which a pair of ohmic electrodes 4, 5 are formed. A high insulation performance is required of a second insulation film 12 constituting a protective insulation film 10 according to the present embodiment. From such a viewpoint, the second insulation film 12 is formed by using a plasma CVD method (plasma excitation frequency: 380 kHz) of low-frequency excitation. When a SiN film is formed by the low-frequency CVD method, ion energy at a forming time is high, so that a dense film with a small number of bonding defects can be formed. Therefore, as for an insulation performance, an insulation performance higher than that of a SiN film formed by a high-frequency CVD method (plasma excitation frequency: 13.56 MHz) can be realized.

Generally, film formation by using the low-frequency CVD method causes a heavy electrical damage to a semiconductor substrate. However, in the protective insulation film 10 according to the present embodiment, since the first insulation film 11 acts as a damage mitigation layer, it becomes possible to form the second insulation film 12 by the low-frequency CVD method.

The first insulation film 11 may be a non-stoichiometric film including a lot of Si—H bonds or N—H bonds, or a SiN film formed under plasma in which a lot of hydrogen plasmas exist.

In order to manufacture the Schottky gate type FET of the present embodiment, the processes of FIG. 6-1A to FIG. 6-2C in the first embodiment are performed.

Hereinafter, a constitution of the protective insulation film 10 in the present embodiment will be described in detail.

The plasma CVD method is used for forming the first insulation film 11. With an excitation frequency of plasma being 13.56 MHz, a high-frequency output being 50 W, a gas flow rate being $SiH_4/N_2/He=3$ sccm/150 sccm/1000 sccm, the first insulation film 11 is formed to be about 5 nm in film thickness. A density of Si—H bonds contained in SiN is about $2.0\times10^{22}/cm^3$, a density of N—H bonds is about $4.0\times10^{21}/cm^3$, and a refractive index is about 2.3.

Next, the plasma CVD method is used for forming the second insulation film 12. With an excitation frequency of plasma being 380 kHz, a high-frequency output being 50 W, a gas flow rate being $SiH_4/N_2/He=10$ sccm/500 sccm/1000 sccm, the second insulation film 12 is formed to be about 35 nm in film thickness. A density of Si—H bonds contained in SiN is about $0.8\times10^{22}/cm^3$, a density of N—H bonds is about $3.0\times10^{21}/cm^3$, and a refractive index is about 2.0.

In the Schottky gate type FET employing the protective insulation film 10, a fluctuation of a drain current due to a trap of a surface of the compound semiconductor region 2 is restricted and a current amount flowing in the insulation film is drastically decreased. By adapting the present invention, an effect similar to that of the first embodiment can be obtained.

As described above, according to the present embodiment, it becomes possible to satisfy both of conflicting requests required of the protective insulation film 10, the requests being improvement of chemical stability on the surface of the compound semiconductor region 2 and the good insulation performance of the insulation film itself, and a Schottky gate type FET with a high performance and a superior reliability can be realized.

—Fourth Embodiment—

The present embodiment corresponds to above-described Inventive Aspect 4, and a constitution of a Schottky gate type FET shown in FIG. 4A will be described together with a manufacturing method thereof.

In the present embodiment, a first insulation film 11 being a SiN film is formed, by using a plasma CVD method, on a compound semiconductor region 2 on which a pair of ohmic electrodes 4, 5 are formed. As described above, since a high insulation performance is required of a second insulation film 12 constituting a protective insulation film 10, a film in a state of almost stoichiometry or a film quasi-equivalent thereto is used. However, if the insulation film is made of SiN, oxygen absorption, moisture absorption and oxidation of a surface tend to proceed. In order to mitigate such phenomena, a third insulation film 13 being an ultrathin film of Si-rich Sin is formed on the second insulation film 12. As the Si rich SiN film, a SiN film is desirable which has a non-stoichiometric property of Si/N ratio being 3/4 or more, for example, and includes $1.0\times10^{22}/cm^3$ or more Si—H bonds, for example, and whose refractive index in relation to a light of 633 nm in wavelength is equal to 2.1 or more. By forming the third insulation film 13, the protective insulation film 10 can achieve a high insulation property in which absorption of oxygen or the like on the surface is mitigated, and a high stabilization effect of a semiconductor surface.

In order to manufacture the Schottky gate type FET of the present embodiment, the processes of FIG. 6-1A to FIG. 6-2C in the first embodiment are performed.

Hereinafter, a constitution of the protective insulation film 10 in the present embodiment will be described in detail.

In the present embodiment, the protective insulation film 10 is formed as follows.

In FIG. 6D, a plasma CVD method is used for forming the first insulation film 11. With an excitation frequency of plasma being 13.56 MHz, a high-frequency output being 50 W, a gas flow rate being $SiH_4/N_2/He=3$ sccm/150 sccm/1000 sccm, the first insulation film 11 is formed to be about 5 nm in film thickness. A density of Si—H bonds contained in SiN is about $2.0\times10^{22}/cm^3$, a density of N—H bonds is about $4.0\times10^{21}/cm^3$, and a refractive index is about 2.3.

Next, the plasma CVD method is used for forming the second insulation film 12. With an excitation frequency of plasma being 13.56 MHz, a high-frequency output being 50 W, a gas flow rate being $SiH_4/N_2/He=2$ sccm/150 sccm/1000 sccm, the second insulation film 12 is formed to be about 35 nm in film thickness. A density of Si—H bonds contained in SiN is about $0.9\times10^{22}/cm^3$, a density of N—H bonds is about $8.0\times10^{21}/cm^3$, and a refractive index is about 2.0.

Next, the plasma CVD method is used for forming the third insulation film 13. With an excitation frequency of plasma being 13.56 MHz, a high-frequency output being 50 W, a gas flow rate being $SiH_4/N_2/He=3$ sccm/150 sccm/1000 sccm, the third insulation film 13 is formed to be about 1 nm in film thickness.

In the Schottky gate type FET employing the protective insulation film 10, a fluctuation of a drain current due to a trap of a surface of the compound semiconductor region 2 is restricted and a current amount flowing in the insulation film is drastically decreased. By adapting the present invention, an effect similar to that of the first embodiment can be obtained.

As described above, according to the present embodiment, it becomes possible to satisfy both of conflicting requests required of the protective insulation film 10, the requests being improvement of chemical stability on the surface of the compound semiconductor region 2 and the good insulation performance of the insulation film itself, and there can be realized a Schottky gate type FET in which excessive absorption of oxygen and the like to an insulation film surface is restricted and which has a high performance and a superior reliability.

—Fifth Embodiment—

The present embodiment corresponds to above-described Inventive Aspect 1 to Inventive Aspect 4, and a constitution of a Schottky gate type FET having a mushroom-type gate electrode shown in FIG. 1B will be described together with a manufacturing method thereof.

FIG. 8-1A to FIG. 8-1D and FIG. 8-2A to FIG. 8-2C are schematic cross-sectional views showing step by step a manufacturing method a Schottky gate type FET (corresponding to FIG. 1B) having a mushroom type gate electrode according to a fifth embodiment.

Figures 1A, 8:
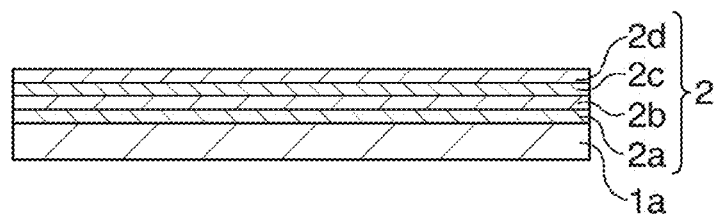
Figures 1B, 8:
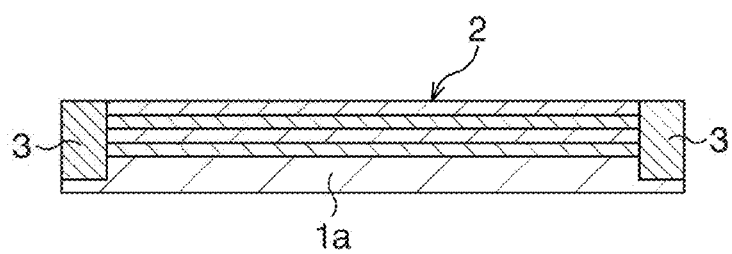
Figures 1C, 8:
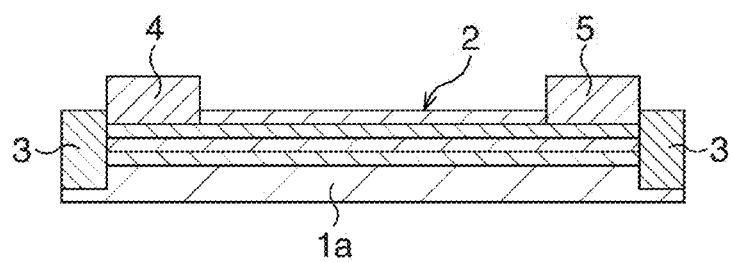
Figures 1D, 8:
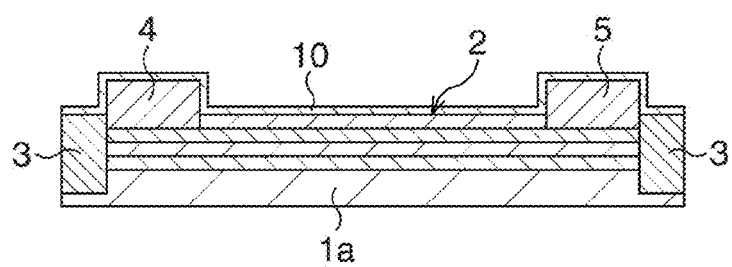
Figures 2A, 8:
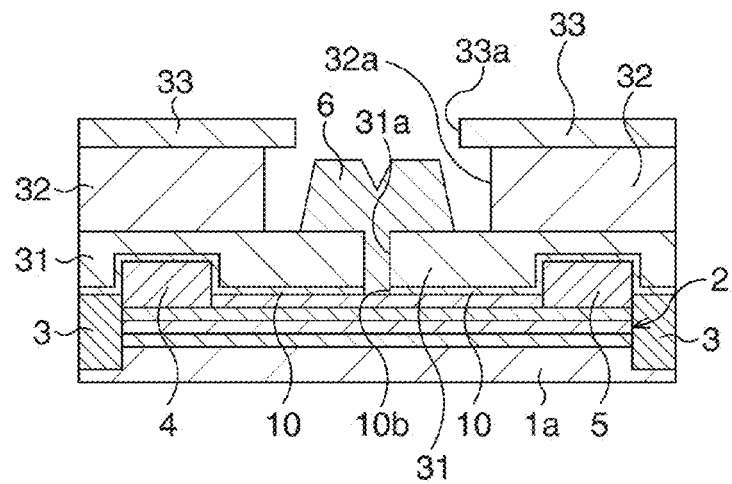
Figures 2B, 8:
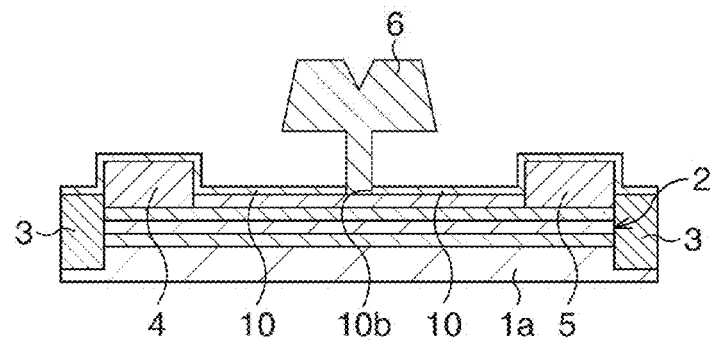
Figures 2C, 8:
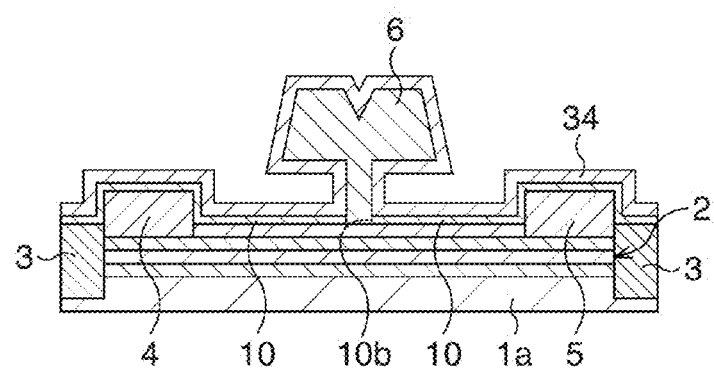

In order to manufacture the Schottky gate type FET having the mushroom type gate electrode according to the present embodiment, first, as shown in FIG. 8-1A, on a semi-insulating Sic substrate 1a are sequentially epitaxially grown by a MOCVD method a buffer layer 2a, an electron transit layer 2b made of GaN, an electron supply layer 2c made of AlGaN, and a surface layer 2d made of GaN, so that a compound semiconductor region 2 is formed. Among the respective layers, the buffer layer 2a plays a role of preventing propagation of a lattice defect of a surface of the SiC substrate 1 to the electron transit layer 2b.

Subsequently, as shown in FIG. 8-1B, for the purpose of inactivating a region (element isolation region) in which an element is not formed, Ar, for example, is injected to form an interelement isolation structure 3, so that an active region is defined on the compound semiconductor region 2.

Subsequently, as shown in FIG. 8-1C, first, an ohmic electrode formation portion of the surface layer 2d is removed by patterning and dry-etching.

Next, on the compound semiconductor region 2 are sequentially deposited Ti and Al in thicknesses of, for example, about 20 nm and about 200 nm respectively by a vacuum deposition method, for example. Then, a lift off is performed with a heated organic solvent, so that a pair of ohmic electrodes 4, 5 are formed on the electron supply layer 2c which is exposed in the above-described ohmic electrode formation portion. Thereafter, by applying a heat treatment, an ohmic contact is formed between the electron supply layer 2c and the ohmic electrodes 4, 5.

Subsequently, as shown in FIG. 8-1D, on an entire compound semiconductor region 2 are sequentially formed, in a manner to cover the ohmic electrodes 4, 5, a first insulation film 11 and a second insulation film 12 of one kind chosen from Inventive Aspect 1 to Inventive Aspect 4, to form a protective insulation film 10.

Subsequently, as shown in FIG. 8-2A, a resist 31 for a fine gate being a positive electron beam resist (brand name: ZEP520-A17, made by Nippon Zeon Co., Ltd.) is applied and formed to be about 300 nm in thickness by a spin-coat method, and then a heat treatment of 180° C. is performed for five minutes.

Next, a lower-layer resist 32 being an alkali-soluble resin (brand name: PMGI, made by MicroChem Corp, U.S.) is applied and formed to be about 500 nm in thickness by the spin-coat method, and then a heat treatment of 180° C. is performed for three minutes.

Further, an upper-layer resist 33 being a positive electron beam resist (brand name: ZEP520-A17, made by Nippon Zeon Co., Ltd.) is applied on the lower-layer resist 32 and formed to be about 200 nm in thickness by the spin-coat method, and then a heat treatment of 180° C. is performed for two minutes.

Next, the upper-layer resist 33, the lower-layer resist 32 and the resist 31 for the fine gate are processed by electron beam lithography. Thereby, a narrow opening 31a for forming a stem part of the gate electrode is formed in the resist 31 for the fine gate, while openings 32a, 33a for forming an umbrella part of the gate electrode are formed in the lower-layer resist 32 and the upper-layer resist 33, respectively.

Here, at a time of the processing of the resist 31 for the fine gate, the protective insulation film 10 is processed subsequently to the resist 31 for the fine gate. Thereby, an opening 10b copying a shape of the opening 31a of the resist 31 for the fine gate is formed in the protective insulation film 10.

Next, with the upper-layer resist 33, the lower-layer resist 32 and the resist 31 for the fine gate being masks, a gate metal (Ni: about 10 nm in film thickness/Au: about 300 nm in film thickness) is vapor deposited on an entire surface including in the openings 33a, 32a, 31a. Here, illustration of the gate metal deposited on the upper-layer resist 33 is omitted for the sake of illustrative convenience.

Subsequently, as shown in FIG. 8-2B, a lift-off is performed by using a heated organic solvent to form a mushroom type gate electrode 6 on the compound semiconductor region 2 in the active region. As stated above, by forming the gate electrode into a mushroom shape whose lower part (stem part) is narrower compared with its upper part (umbrella part), a FET superior in electric characteristic and the like is realized.

Subsequently, as shown in FIG. 8-2C, a SiN film 34 is formed in a manner to cover the compound semiconductor region 2 including the gate electrode 6 as necessary. Thereby, the entire compound semiconductor region 2 is coated with SiN, so that a reliability such as moisture resistance is improved.

Thereafter, after processes of forming an interlayer insulation film, a contact hole, various wirings and the like, the Schottky gate type FET according to the present embodiment is completed.

As described above, in the present embodiment, it is possible to choose one kind from the protective insulation films 10 described in the first to fourth embodiments, to apply as the protective insulation film 10. As for a crystal (epi) structure, the surface layer made of GaN may not be used depending on required characteristics, but such a structure is also a device structure which enables an effect of the present invention.

As described above, according to the present embodiment, it becomes possible to satisfy both of conflicting requests required of the protective insulation film 10, the requests being improvement of chemical stability on the surface of the compound semiconductor region 2 and a good insulation performance of the insulation film itself, and a Schottky gate type FET with a high performance and a superior reliability can be realized. When the protective insulation film 10 described in the fourth embodiment is used as a protective insulation film 10, in addition to the above-described effects, excessive absorption of oxygen and the like to the insulation film surface can be restricted.

—Sixth Embodiment—

The present embodiment corresponds to above-described Inventive Aspect 1 to Inventive Aspect 4, and a constitution of a Schottky gate type FET having a mushroom type gate electrode shown in FIG. 1C will be described together with a manufacturing method thereof.

FIG. 9-1A to FIG. 9-1F and FIG. 9-2A to FIG. 9-2D are schematic cross-sectional views showing step by step a manufacturing method of a Schottky gate type FET (corresponding to FIG. 1C) having a mushroom type gate electrode according to a sixth embodiment.

Figures 1A, 9:
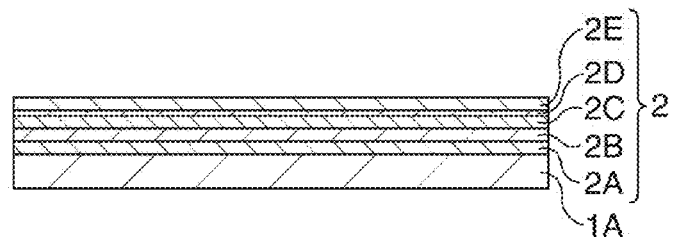
Figures 1B, 9:
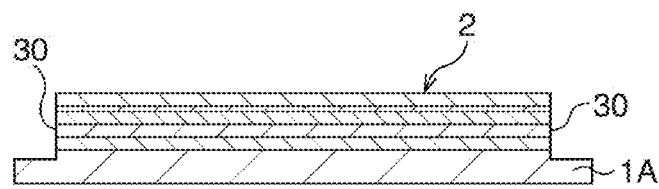
Figures 1C, 9:
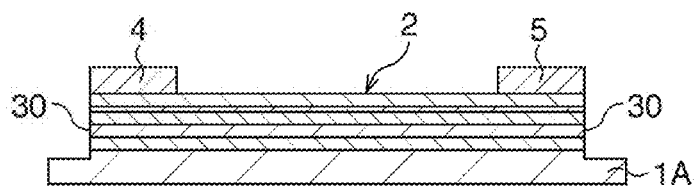
Figures 1D, 9:
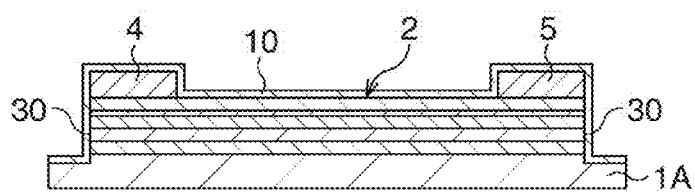
Figures 1E, 9:
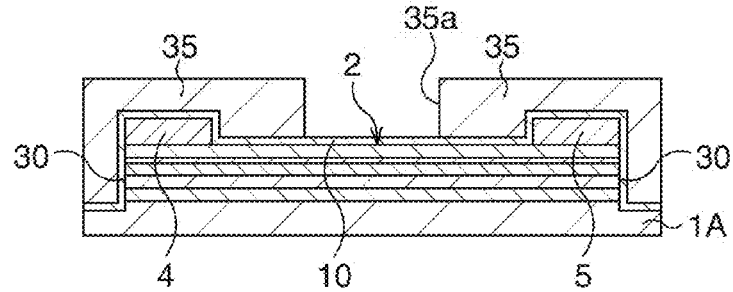

In order to manufacture the Schottky gate type FET having the mushroom type gate electrode according to the present embodiment, first, as shown in FIG. 9-1A, on a semi-insulating InP substrate 1A are sequentially epitaxially grown by a MOCVD method a buffer layer 2A, an electron transit layer 2B made of InGaAs, an electron supply layer 2C made of InAlAs, an etching stopper layer 2D made of InP, and a low resistance layer 2E made of InGaAs, so that a compound semiconductor region 2 is formed. Among the respective layers, the buffer layer 2A plays a role of preventing propagation of a lattice defect of a surface of the InP substrate 1A to the electron transit layer 2B.

Subsequently, as shown in FIG. 9-1B, a region (element isolation region) of the compound semiconductor region 2, in which an element is not formed, is removed by mesa etching, for example, to form a mesa etching region 30, so that an active region is defined on the compound semiconductor region 2.

Subsequently, as shown in FIG. 9-1C, on the compound semiconductor region 2 are sequentially deposited Ti, Pt and Au in thicknesses of, for example, about 20 nm, about 50 nm and about 200 nm respectively, by patterning and a vacuum deposition method, for example. Then, a lift off is performed with a heated organic solvent to form a pair of ohmic electrodes 4, 5 on the compound semiconductor region 2, so that an ohmic contact is formed between the low resistance layer 2E and the ohmic electrodes 4, 5.

Subsequently, as shown in FIG. 9-1D, on an entire surface including on the compound semiconductor region 2 are sequentially deposited, in a manner to cover the ohmic electrodes 4, 5, a first insulation film 11 and a second insulation film 12 of one kind chosen from Inventive Aspect 1 to Inventive Aspect 4, to form a protective insulation film 10.

Subsequently, as shown in FIG. 9-1E, in order to remove the low resistance layer 2E to be about 0.1 μm in width in both ends of a gate finger (stem part of the gate electrode) in the active region, a resist 35 being a positive electron beam resist (brand name: ZEP520-A17, made by Nippon Zeon Co., Ltd.) is applied on the compound semiconductor region 2 and formed to be about 300 nm in thickness by a spin-coat method, and then a heat treatment of 180° C. is performed for five minutes.

Then, the resist 35 is processed by electron-beam lithography, so that an opening 35a is formed in the resist 35.

Figures 1F, 9:
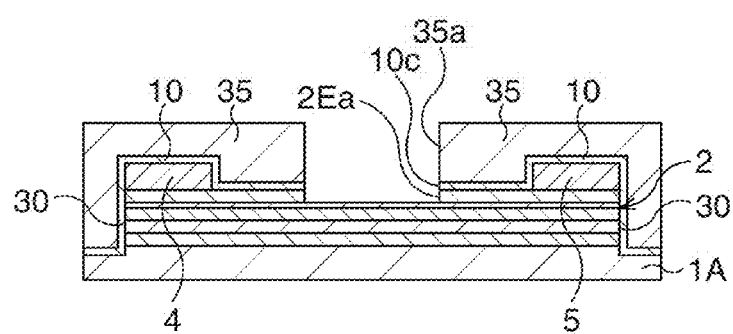
Figures 2A, 9:
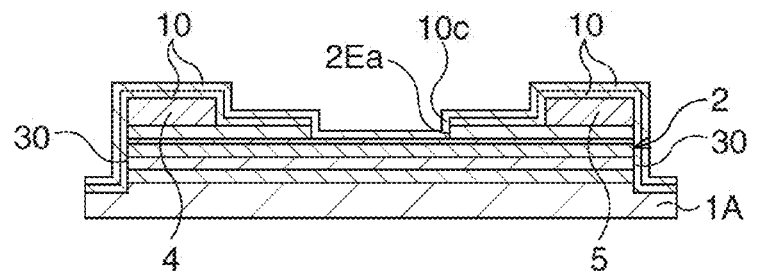
Figures 2B, 9:
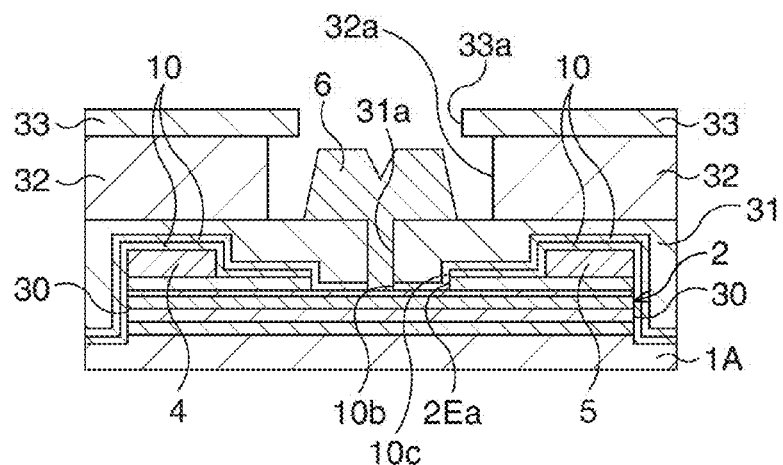
Figures 2C, 9:
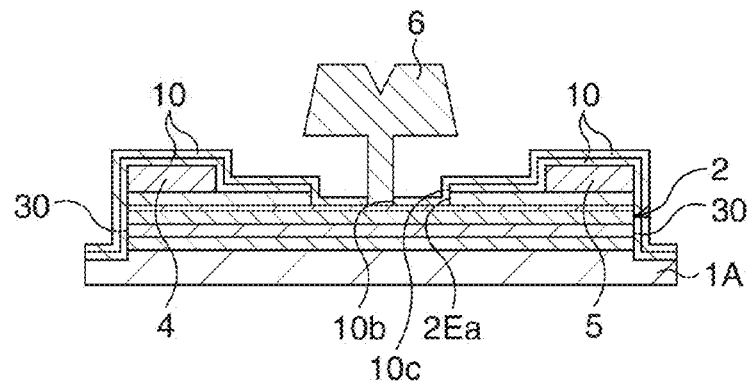

Subsequently, as shown in FIG. 9-1F, with the resist 35 being a mask and using $SF_6$ as an etching gas, the protective insulation film 10 is dry etched. On this occasion, an opening 10c with a shape copying the opening 35a is formed in the protective insulation film 10.

Thereafter, with the resist 35 being a mask, the low resistance layer 2E is wet etched until part of a surface of the etching stopper layer 2D is exposed, so that an opening 2Ea with a shape copying the opening 35a is formed in the low resistance layer 2E. In principle, the opening 2Ea recedes from the opening 10c in the process, but illustration of a recession is omitted.

Subsequently, after the resist 35 is removed by a peeling treatment or the like, as shown in FIG. 9-2A, on an entire surface including on the compound semiconductor region 2 are sequentially deposited, in a manner to cover the protective insulation film 10 including the exposed etching stopper layer 2D, a first insulation film 11 and a second insulation film 12 of one kind chosen from Inventive Aspect 1 to Inventive Aspect 4, to form a protective insulation film 10 again.

Subsequently, as shown in FIG. 9-2B, a resist 31 for a fine gate being a positive electron beam resist (brand name: ZEP520-A17, made by Nippon Zeon Co., Ltd.) is applied and formed to be about 300 nm in thickness by the spin-coat method, and then a heat treatment of 180° C. is performed for five minutes.

Next, a lower-layer resist 32 being an alkali-soluble resin (brand name: PMGI, made by MicroChem Corp, U.S.) is applied and formed to be about 500 nm in thickness by the spin-coat method, and then a heat treatment of 180° C. is performed for three minutes.

Further, an upper-layer resist 33 being a positive electron beam resist (brand name: ZEP520-A17, made by Nippon Zeon Co., Ltd.) is applied on the lower-layer resist 32 and formed to be about 200 nm in thickness by the spin-coat method, and then a heat treatment of 180° C. is performed for two minutes.

Next, the upper-layer resist 33, the lower-layer resist 32 and the resist 31 for the fine gate are processed by the electron beam lithography. Thereby, a narrow opening 31a for forming a stem part of the gate electrode is formed in the resist 31 for the fine gate, while openings 32a, 33a for forming an umbrella part of the gate electrode are formed in the lower-layer resist 32 and the upper-layer resist 33, respectively.

Next, with the resist 31 for the fine gate being a mask, the protective insulation film 10 is dry etched until part of the surface of the etching stopper layer 2D is exposed. Thereby, an opening 10b copying a shape of the opening 31a of the resist 31 for the fine gate is formed in the protective insulation film 10.

Next, with the upper-layer resist 33, the lower-layer resist 32 and the resist 31 for the fine gate being masks, a gate metal (Ti: about 20 nm in film thickness/Pt: about 50 nm in film thickness/Au: about 300 nm in film thickness) is vapor deposited on an entire surface including in the openings 33a, 32a, 31a. Here, illustration of the gate metal deposited on the upper-layer resist 33 is omitted for the sake of illustrative convenience.

Subsequently, as shown in FIG. 9-2C, a lift-off is performed by using a heated organic solvent to form a mushroom type gate electrode 6 on the compound semiconductor region 2 in the active region. As stated above, by forming the gate electrode into a mushroom shape whose lower part (stem part) is narrower compared with its upper part (umbrella part), a FET superior in electric characteristic and the like is realized.

Figures 2D, 9:
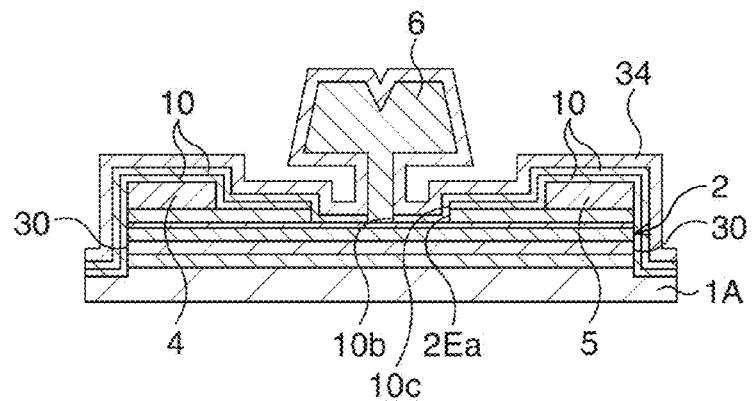

Subsequently, as shown in FIG. 9-2D, a SiN film 34 is formed in a manner to cover the compound semiconductor region 2 including the gate electrode 6, as necessary. Thereby, the entire compound semiconductor region 2 is coated with SiN, so that a reliability such as moisture resistance is improved.

Thereafter, after processes of forming an interlayer insulation film, a contact hole, various wirings and the like, the Schottky gate type FET according to the present embodiment is completed.

As described above, in the present embodiment, it is possible to choose one kind from the protective insulation films 10 described in the first to fourth embodiments, to apply as the protective insulation film 10.

As described above, according to the present embodiment, it becomes possible to satisfy both of conflicting requests required of the protective insulation film 10, the requests being improvement of chemical stability on the surface of the compound semiconductor region 2 and a good insulation performance of the insulation film itself, and a Schottky gate type FET with a high performance and a superior reliability can be realized. When the protective insulation film 10 described in the fourth embodiment is used as a protective insulation film 10, in addition to the above-described effects, excessive absorption of oxygen and the like to the insulation film surface can be restricted.

—Seventh Embodiment—

The present embodiment corresponds to above-described Inventive Aspect 1 to Inventive Aspect 4, and a constitution of a MIS gate type FET shown in FIG. 2A will be described together with a manufacturing method thereof.

FIG. 10-1A to FIG. 10-1D and FIG. 10-2A to FIG. 10-2B are schematic cross-sectional views showing step by step a manufacturing method of a MIS gate type FET (corresponding to FIG. 2A) according to a seventh embodiment.

Figures 1A, 10:
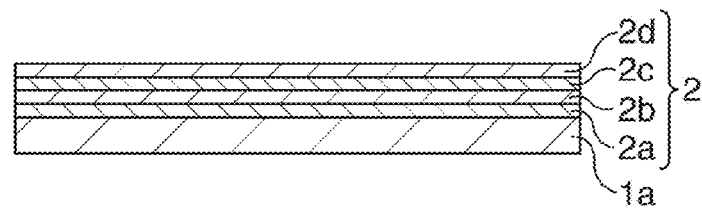
Figures 1B, 10:
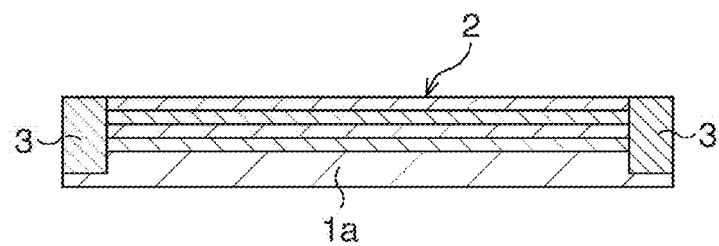
Figures 1C, 10:
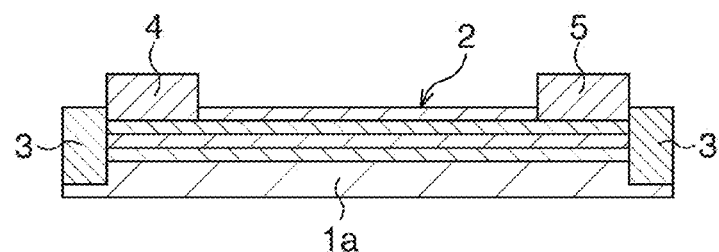
Figures 1D, 10:
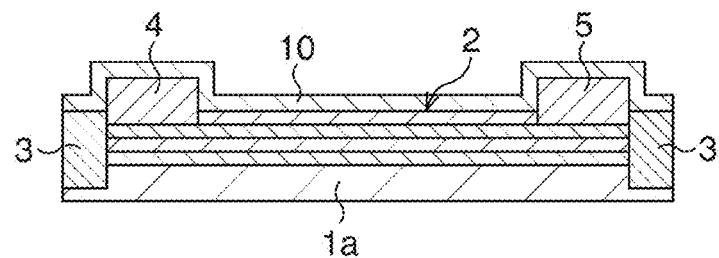
Figures 2A, 10:
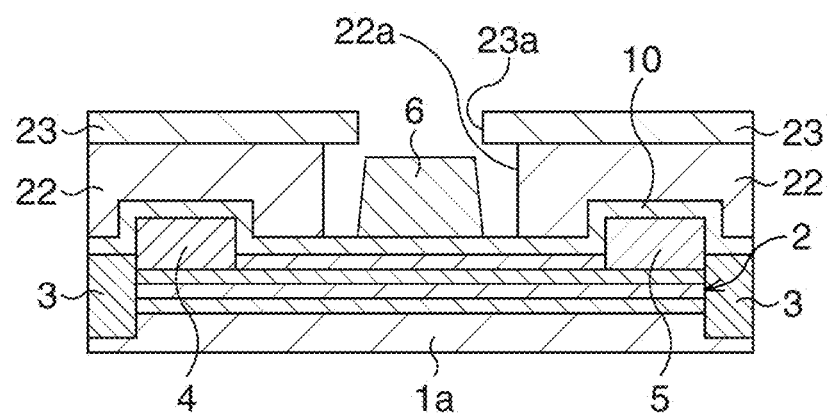
Figures 2B, 10:
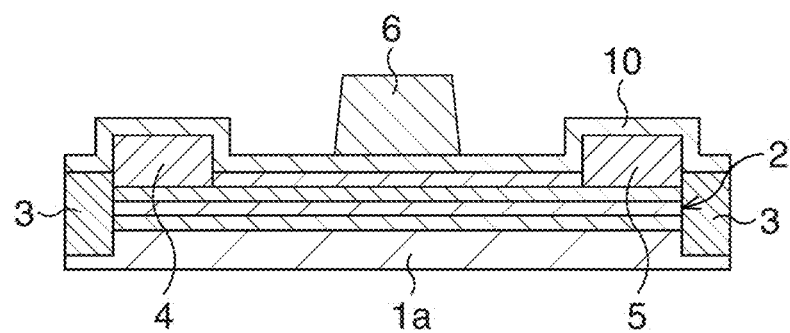

In order to manufacture the MIS gate type FET of the present embodiment, first, as shown in FIG. 10-1A, on a semi-insulating SiC substrate 1a are sequentially epitaxially grown by a MOCVD method a buffer layer 2a, an electron transit layer 2b made of GaN, an electron supply layer 2c made of AlGaN, and a surface layer 2d made of GaN, so that a compound semiconductor region 2 is formed. Among the respective layers, the buffer layer 2a plays a role of preventing propagation of a lattice defect of a surface of the SiC substrate 1a to the electron transit layer 2b.

Subsequently, as shown in FIG. 10-1B, for the purpose of inactivating a region (element isolation region) in which an element is not formed, Ar, for example, is injected to form an interelement isolation structure 3, so that an active region is defined on the compound semiconductor region 2.

Subsequently, as shown in FIG. 10-1C, after patterning and dry etching of the surface layer 2d are performed, for example, on the compound semiconductor region 2 are sequentially deposited Ti and Al in thicknesses of, for example, about 20 nm and about 200 nm respectively, by a vacuum deposition method. Then, a lift off is performed with a heated organic solvent, so that a pair of ohmic electrodes 4, 5 are formed. Subsequently, by applying a heat treatment, an ohmic contact is formed between the compound semiconductor region 2 and the ohmic electrodes 4, 5.

Subsequently, as shown in FIG. 10-1D, on an entire compound semiconductor region 2 are sequentially deposited in a manner to cover the ohmic electrodes 4, 5, a first insulation film 11 and a second insulation film 12, in correspondence with Inventive Aspect 1 to Inventive Aspect 4, to form a protective insulation film 10.

Subsequently, as shown in FIG. 10-2A, a lower-layer resist 22 (brand name: PMGI, made by MicroChem Corp, U.S.) and an upper-layer resist (brand name: PF132-A8, made by Sumitomo Chemical Co., Ltd.) are applied and formed respectively by a spin-coat method, for example, and an opening 23a of 0.8 μm in diameter is formed on the upper-layer resist 23 by ultraviolet exposure.

Next, with the upper-layer resist 23 being a mask, the lower-layer resist 22 is wet etched with an alkaline developing solution. By this etching, an opening 22a is formed in the lower-layer resist 22, so that an eaves structure shown in the drawing is formed.

Next, with the upper-layer resist 23 and the lower-layer resist 22 being masks, a gate metal (Ni: about 10 nm in film thickness/Au: about 300 nm in film thickness) is vapor deposited on an entire surface including in the openings 23a, 22a. Here, illustration of the gate metal deposited on the upper-layer resist 23 is omitted for the sake of illustrative convenience.

Subsequently, as shown in FIG. 10-2B, a lift-off is performed by using a heated organic solvent to form a gate electrode 6 on the protective insulation film in the active region. In the MIS gate type FET according to the present embodiment, the protective insulation film 10 existing under the gate electrode 6 functions as a gate insulation film.

Thereafter, after processes of forming an interlayer insulation film, a contact hole, various wirings and the like, the MIS gate type FET according to the present embodiment is completed.

As described above, in the present embodiment, it is possible to choose one kind from the protective insulation films 10 described in the first to fourth embodiments to apply as the protective insulation film 10. As for a crystal (epi) structure, the surface layer made of GaN may not be used depending on required characteristics, but such a structure is also a device structure which enables an effect of the present invention.

As described above, according to the present embodiment, it becomes possible to satisfy both of conflicting requests required of the protective insulation film 10, the requests being improvement of chemical stability on the surface of the compound semiconductor region 2 and a good insulation performance of the insulation film itself, and a MIS gate type FET with a high performance and a superior reliability can be realized. When the protective insulation film 10 described in the fourth embodiment is used as the protective insulation film 10, in addition to the above-described effects, excessive absorption of oxygen and the like to the insulation film surface can be restricted.

—Eighth Embodiment—

The present embodiment corresponds to above-described Inventive Aspect 1 to Inventive Aspect 4, and a constitution of a MIS gate type FET having a mushroom type gate electrode shown in FIG. 2B will be described together with a manufacturing method thereof.

FIG. 11-1A to FIG. 11-1D and FIG. 11-2A to FIG. 11-2C are schematic cross-sectional views showing step by step a manufacturing method of a MIS gate type FET (corresponding to FIG. 2B) having a mushroom type gate electrode according to an eighth embodiment.

Figures 1A, 11:
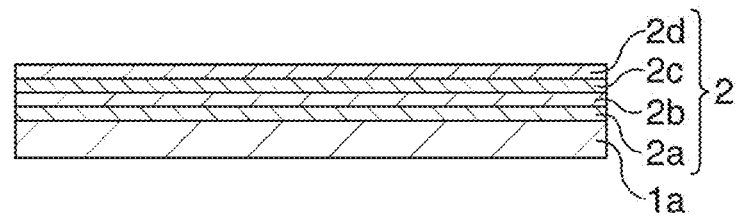
Figures 1B, 11:
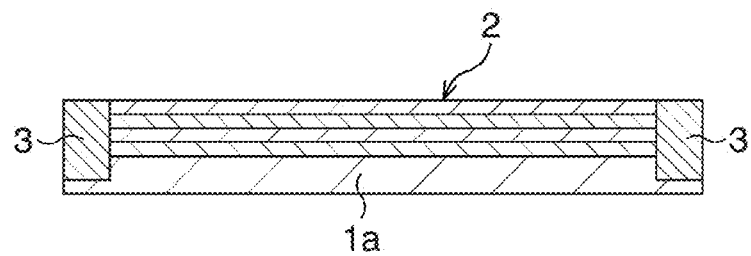
Figures 1C, 11:
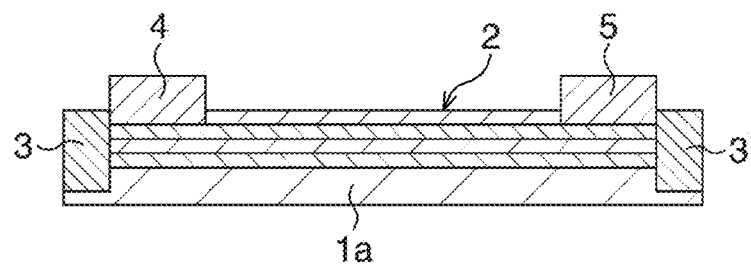
Figures 1D, 11:
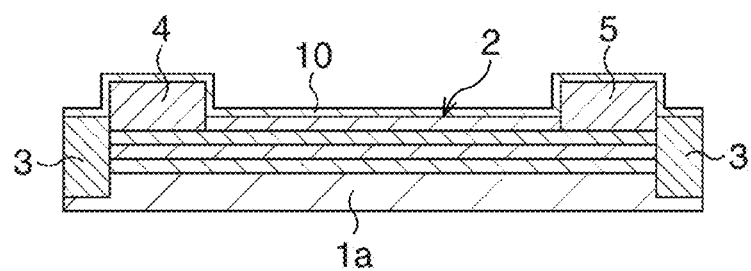
Figures 2A, 11:
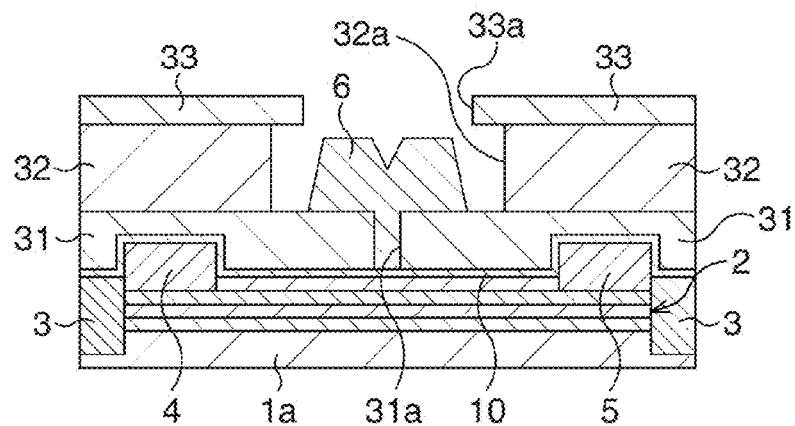
Figures 2B, 11:
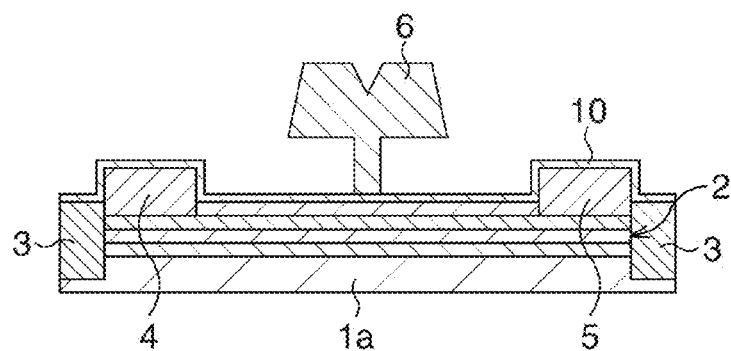
Figures 2C, 11:
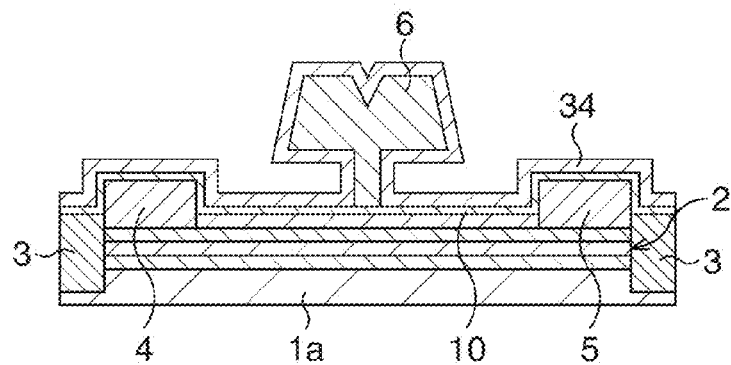

In order to manufacture the MIS gate type FET having the mushroom type gate electrode according to the present embodiment, first, as shown in FIG. 11-1A, on a semi-insulating SiC substrate 1a are sequentially epitaxially grown by a MOCVD (Metal Organic Chemical Vapor Deposition) method a buffer layer 2a, an electron transit layer 2b made of GaN, an electron supply layer 2c made of AlGaN, and a surface layer 2d made of GaN, so that a compound semiconductor region 2 is formed. Among the respective layers, the buffer layer 2a plays a role of preventing propagation of a lattice defect of a surface of the SiC substrate 1a to the electron transit layer 2b.

Subsequently, as shown in FIG. 11-1B, for the purpose of inactivating a region (element isolation region) in which an element is not formed, Ar, for example, is injected to form an interelement isolation structure 3, so that an active region is defined on the compound semiconductor region 2.

Subsequently, as shown in FIG. 11-1C, first, an ohmic electrode formation portion of the surface layer 2d is removed by patterning and dry etching.

Next, on the compound semiconductor region 2 are sequentially deposited Ti and Al in thicknesses of about 20 nm and about 200 nm, for example, respectively by a vacuum deposition method, for example. Then, a lift off is performed with a heated organic solvent, so that a pair of ohmic electrodes 4, 5 are formed on the electron supply layer 2c which is exposed in the above-described ohmic electrode formation portion. Thereafter, by applying a heat treatment, an ohmic contact is formed between the electron supply layer 2c and the ohmic electrodes 4, 5.

Subsequently, as shown in FIG. 11-1D, on an entire surface of the compound semiconductor region 2 are sequentially deposited, in a manner to cover the ohmic electrodes 4, 5, a first insulation film 11 and a second insulation film 12 of one kind chosen from Inventive Aspect 1 to Inventive Aspect 4, to form a protective insulation film 10.

Subsequently, as shown in FIG. 11-2A, a resist 31 for a fine gate being a positive electron beam resist (brand name: ZEP520-A17, made by Nippon Zeon Co., Ltd.) is applied and formed to be about 300 nm in thickness by a spin-coat method, and then a heat treatment of 180° C. is performed for five minutes.

Next, a lower-layer resist 32 being an alkali-soluble resin (brand name: PMGI, made by MicroChem Corp, U.S.) is applied and formed to be about 500 nm in thickness by the spin-coat method, and then a heat treatment of 180° C. is performed for three minutes.

Further, an upper-layer resist 33 being a positive electron beam resist (brand name: ZEP520-A17, made by Nippon Zeon Co., Ltd.) is applied on the lower-layer resist 32 and formed to be about 200 nm in thickness by the spin-coat method, and then a heat treatment of 180° C. is performed for two minutes.

Next, the upper-layer resist 33, the lower-layer resist 32 and the resist 31 for the fine gate are processed by electron beam lithography. Thereby, a narrow opening 31a for forming a stem part of the gate electrode is formed in the resist 31 for the fine gate, while openings 32a, 33a for forming an umbrella part of the gate electrode are formed in the lower-layer resist 32 and the upper-layer resist 33, respectively.

Next, with the upper-layer resist 33, the lower-layer resist 32 and the resist 31 for the fine gate being masks, a gate metal (Ni: about 10 nm in film thickness/Au: about 300 nm in film thickness) is vapor deposited on an entire surface including in the openings 33a, 32a, 31a. Here, illustration of the gate metal deposited on the upper-layer resist 33 is omitted for the sake of illustrative convenience.

Subsequently, as shown in FIG. 11-2B, a lift-off is performed by using a heated organic solvent to form a mushroom type gate electrode 6 on the protective insulation film 10 in the active region. In the MIS gate type FET according to the present embodiment, the protective insulation film 10 existing under the gate electrode 6 functions as a gate insulation film. As stated above, by forming the gate electrode 6 into a mushroom shape whose lower part (stem part) is narrower compared with its upper part (umbrella part), a FET superior in electric characteristic and the like is realized.

Subsequently, as shown in FIG. 11-2C, a SiN film 34 is formed as necessary in a manner to cover the compound semiconductor region 2 including the gate electrode 6. Thereby, the entire compound semiconductor region 2 is coated with SiN, so that a reliability such as moisture resistance is improved.

Thereafter, after processes of forming an interlayer insulation film, a contact hole, various wirings and the like, the MIS gate type FET according to the present embodiment is completed.

As described above, in the present embodiment, it is possible to choose one kind from the protective insulation films 10 described in the first to fourth embodiments to apply as the protective insulation film 10. As for a crystal (epi) structure, the surface layer made of GaN may not be used depending on required characteristics, but such a structure is also a device structure which enables an effect of the present invention.

As described above, according to the present embodiment, it becomes possible to satisfy both of conflicting requests required of the protective insulation film 10, the requests being improvement of chemical stability on the surface of the compound semiconductor region 2 and a good insulation performance of the insulation film itself, and a MIS gate type FET with a high performance and a superior reliability can be realized. When the protective insulation film 10 described in the fourth embodiment is used as the protective insulation film 10, in addition to the above-described effects, excessive absorption of oxygen and the like to the insulation film surface can be restricted.

—Ninth Embodiment—

The present embodiment corresponds to above-described Inventive Aspect 1 to Inventive Aspect 4, and a constitution of a MIS gate type FET having a mushroom type gate electrode shown in FIG. 2C will be described together with a manufacturing method thereof.

FIG. 12-1A to FIG. 12-1F and FIG. 12-2A to FIG. 12-2D are schematic cross-sectional views showing step by step a manufacturing method of a MIS gate type FET (corresponding to FIG. 2C) having a mushroom type gate electrode according to a ninth embodiment.

Figures 1A, 12:
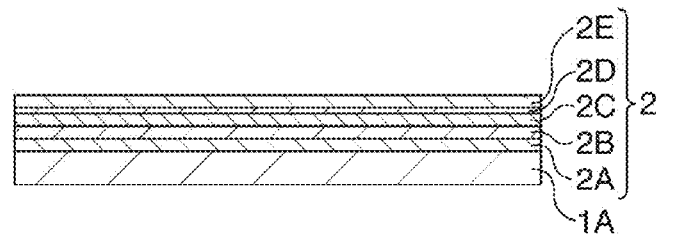
Figures 1B, 12:
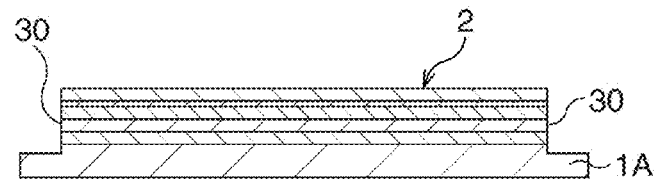
Figures 1C, 12:
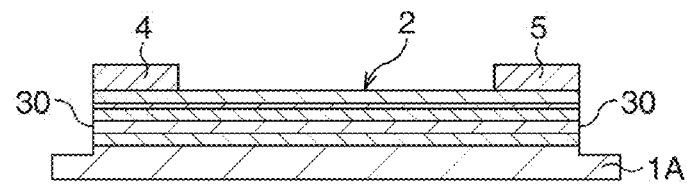
Figures 1D, 12:
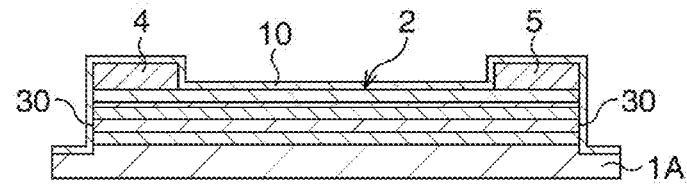
Figures 1E, 12:
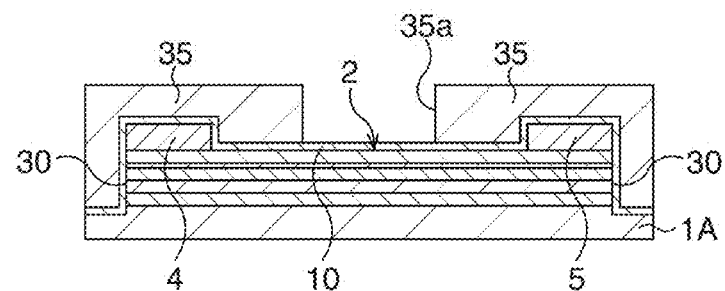
Figures 1F, 12:
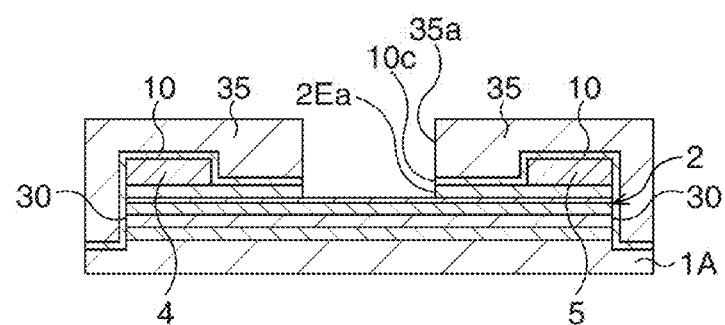
Figures 2A, 12:
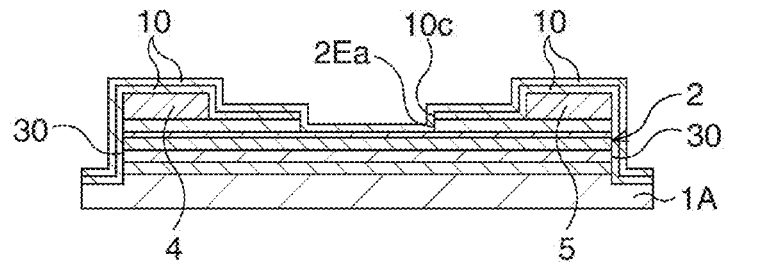
Figures 2B, 12:
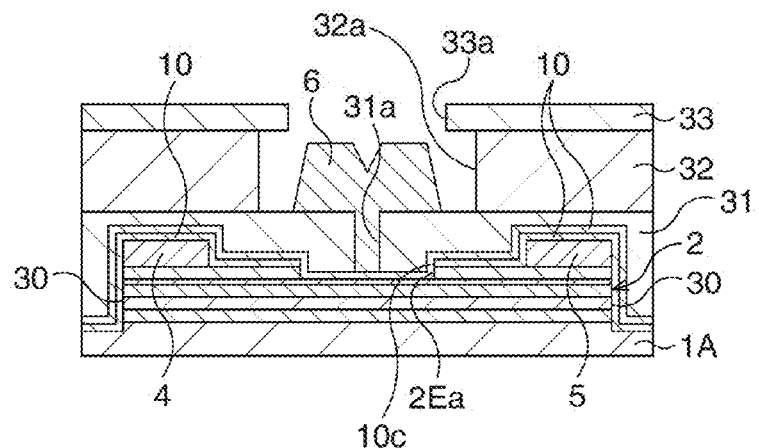
Figures 2C, 12:
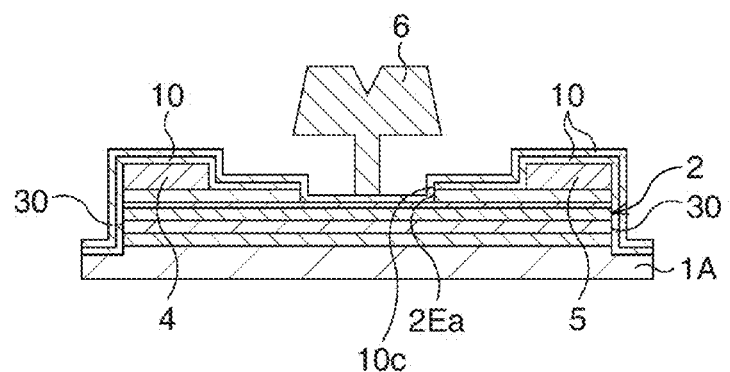
Figures 2D, 12:
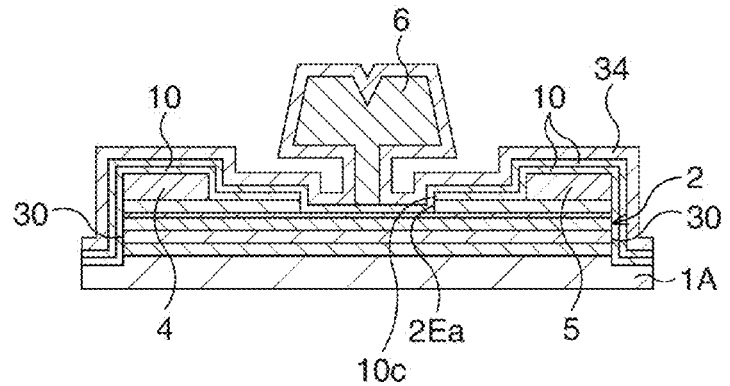

In order to manufacture the MIS gate type FET having the mushroom type gate electrode according to the present embodiment, first, as shown in FIG. 12-1A, on a semi-insulating InP substrate 1A are sequentially epitaxially grown by a MOCVD method a buffer layer 2A, an electron transit layer 2B made of InGaAs, an electron supply layer 2C made of InAlAs, an etching stopper layer 2D made of InP, and a low resistance layer 2E made of InGaAs, so that a compound semiconductor region 2 is formed. Among the respective layers, the buffer layer 2A plays a role of preventing propagation of a lattice defect of a surface of the InP substrate 1A to the electron transit layer 2B.

Subsequently, as shown in FIG. 12-1B, a region (element isolation region) of the compound semiconductor region 2, in which an element is not formed, is removed by mesa etching, for example, to form a mesa etching region 30, so that an active region is defined on the compound semiconductor region 2.

Subsequently, as shown in FIG. 12-1C, on the compound semiconductor region 2 are sequentially deposited Ti, Pt and Au in thicknesses of, for example, about 20 nm, about 50 nm and about 200 nm respectively by patterning and a vacuum deposition method, for example. Then, a lift off is performed by lithography, and a pair of ohmic electrodes 4, 5 are formed on the compound semiconductor region 2, so that an ohmic contact is formed between the low resistance layer 2E and the ohmic electrodes 4, 5.

Subsequently, as shown in FIG. 12-1D, on an entire surface of the compound semiconductor region 2 are sequentially deposited, in a manner to cover the ohmic electrodes 4, 5, a first insulation film 11 and a second insulation film 12 of one kind chosen from Inventive Aspect 1 to Inventive Aspect 4, to form a protective insulation film 10.

Subsequently, as shown in FIG. 12-1E, in order to remove the low resistance layer 2E to be about 0.1 μm in width in both ends of a gate finger (stem part of the gate electrode) in the active region, a resist 35 being a positive electron beam resist (brand name: ZEP520-A17, made by Nippon Zeon Co., Ltd.) is applied on the compound semiconductor region 2 and formed to be about 300 nm in thickness by the spin-coat method, and then a heat treatment of 180° C. is performed for five minutes.

Then, the resist 35 is processed by electron-beam lithography, so that an opening 35a is formed in the resist 35.

Subsequently, as shown in FIG. 12-1F, with the resist 35 being a mask and using $SF_6$ as an etching gas, the protective insulation film 10 is dry etched. On this occasion, an opening 10c with a shape copying the opening 35a is formed in the protective insulation film 10.

Thereafter, with the resist 35 being a mask, the low resistance layer 2E is wet etched until part of a surface of the etching stopper layer 2D is exposed, so that an opening 2Ea with a shape copying the opening 35a is formed on the low resistance layer 2E. In principle, the opening 2Ea recedes from the opening 10c in the process, but illustration of recession is omitted.

Subsequently, after the resist 35 is removed by a peeling treatment or the like, as shown in FIG. 12-2A, on an entire surface including on the compound semiconductor region 2 are sequentially deposited, in a manner to cover the protective insulation film 10 including the exposed etching stopper layer 2D, a first insulation film 11 and a second insulation film 12 of one kind chosen from Inventive Aspect 1 to Inventive Aspect 4, to form a protective insulation film 10 again.

Subsequently, as shown in FIG. 12-2B, a resist 31 for a fine gate being a positive electron beam resist (brand name: ZEP520-A17, made by Nippon Zeon Co., Ltd.) is applied and formed to be about 300 nm in thickness by the spin-coat method, and then a heat treatment of 180° C. is performed for five minutes.

Next, a lower-layer resist 32 being an alkali-soluble resin (brand name: PMGI, made by MicroChem Corp, U.S.) is applied and formed to be about 500 nm in thickness by the spin-coat method, and then the heat treatment of 180° C. is performed for three minutes.

Further, an upper-layer resist 33 being a positive electron beam resist (brand name: ZEP520-A17, made by Nippon Zeon Co., Ltd.) is applied on the lower-layer resist 32 and formed to be about 200 nm in thickness by the spin-coat method, and then a heat treatment of 180° C. is performed for two minutes.

Next, the upper-layer resist 33, the lower-layer resist 32 and the resist 31 for the fine gate are processed by electron beam lithography. Thereby, a narrow opening 31a for forming a stem part of the gate electrode is formed in the resist 31 for the fine gate, while openings 32a, 33a for forming an umbrella part of the gate electrode are formed in the lower-layer resist 32 and the upper-layer resist 33, respectively.

Next, with the upper-layer resist 33, the lower-layer resist 32 and the resist 31 for the fine gate being masks, a gate metal (Ti: about 20 nm in film thickness/Pt: about 50 nm in film thickness/Au: about 300 nm in film thickness) is vapor deposited on an entire surface including in the openings 33a, 32a, 31a. Here, illustration of the gate metal deposited on the upper-layer resist 33 is omitted for the sake of illustrative convenience.

Subsequently, as shown in FIG. 12-2C, a lift-off is performed by using a heated organic solvent to form a mushroom type gate electrode 6 on the protective insulation film 10 in the active region. In the MIS gate type FET according to the present embodiment, the protective insulation film 10 existing under the gate electrode 6 functions as a gate insulation film. As stated above, by forming the gate electrode 6 into a mushroom shape whose lower part (stem part) is narrower compared with its upper part (umbrella part), a FET superior in electric characteristic and the like is realized.

Subsequently, as shown in FIG. 12-2D, a SiN film 34 is formed as necessary in a manner to cover the compound semiconductor region 2 including the gate electrode 6. Thereby, the entire compound semiconductor region 2 is coated with SiN, so that a reliability such as moisture resistance is improved.

Thereafter, after processes of forming an interlayer insulation film, a contact hole, various wirings and the like, the MIS gate type FET according to the present embodiment is completed.

It should be noted that though, in the present embodiment similarly to in the sixth embodiment, there is exemplified a case that the etching stopper layer 2D made of InP is provided as a constitutional element of the compound semiconductor region 2, a constitution without providing the etching stopper layer 2D can also be considered.

As described above, in the present embodiment, it is possible to choose one kind from the protective insulation films 10 described in the first to fourth embodiments to apply as the protective insulation film 10.

As described above, according to the present embodiment, it becomes possible to satisfy both of conflicting requests required of the protective insulation film 10, the requests being improvement of chemical stability on the surface of the compound semiconductor region 2 and a good insulation performance of the insulation film itself, and a MIS gate type FET with a high performance and a superior reliability can be realized. When the protective insulation film 10 described in the fourth embodiment is used as the protective insulation film 10, in addition to the above-described effects, excessive absorption of oxygen and the like to the insulation film surface can be restricted.

According to the present invention, it is possible to realize a semiconductor device which satisfies both of conflicting requests required of a protective insulation film, the requests being improvement of chemical stability on a surface of a compound semiconductor region and a good insulation performance of an insulation film itself and which is highly efficient and superior in reliability.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device, comprising:
    forming a protective insulation film to have a two-layer structure constituted by a first insulation film formed into a state that a degree of chemical activity to a surface of a compound semiconductor region is high and a second insulation film stacked on the first insulation film, a chemical activity degree of the second insulation film being lower than that of the first insulation film, in forming the protective insulation film covering at least part of the surface of the compound semiconductor region,
    wherein the first insulation film is a silicon nitride film and includes $1.0 \times 10^{22}/cm^3$ or more Si—H bonds, or
    the first insulation film is a silicon nitride film and includes $1.0 \times 10^{22}/cm^3$ or more N—H bonds.

2. The manufacturing method of the semiconductor device according to claim 1,
    wherein the first insulation film has a non-stoichiometric property.

3. The manufacturing method of the semiconductor device according to claim 1,
    wherein the first insulation film is formed by a plasma CVD method including an $NH_3$ gas as a material gas.

4. The manufacturing method of the semiconductor device according to claim 1,
    wherein the second insulation film is formed by a plasma CVD method of low frequency excitation.

5. The manufacturing method of the semiconductor device according to claim 1,
    wherein the protective insulation film is formed to have a third insulation film stacked on the two-layer structure, the third insulation film being a silicon nitride film with Si or N ratio equal to or more than 3/4.

* * * * *